(12) United States Patent
Pakonen et al.

(10) Patent No.: US 6,445,189 B1
(45) Date of Patent: Sep. 3, 2002

(54) METHOD AND SYSTEM FOR IDENTIFYING CAUSE OF PARTIAL DISCHARGES

(75) Inventors: Pertti Pakonen, Tampere; Mats Björkqvist, Vaasa; Vesa Latva-Pukkila, Tampere, all of (FI)

(73) Assignee: ABB Substation Automation Oy, Vaasa (FI)

( * ) Notice: Subject to any disclaimer, the term of this patent is extended or adjusted under 35 U.S.C. 154(b) by 0 days.

(21) Appl. No.: 09/690,309

(22) Filed: Oct. 17, 2000

(30) Foreign Application Priority Data

Oct. 19, 1999 (FI) .............................................. 19992259

(51) Int. Cl.$^7$ .............................................. G01R 31/08
(52) U.S. Cl. ........................ 324/536; 324/523; 324/533
(58) Field of Search ................................ 324/532, 533, 324/534, 535, 536, 528, 551, 537, 543; 702/58

(56) References Cited

U.S. PATENT DOCUMENTS

| | | | | |
|---|---|---|---|---|
| 3,991,364 A | * | 11/1976 | Wiznerowicz | ............... 324/533 |
| 5,416,418 A | * | 5/1995 | Maureira et al. | ........... 324/535 |
| 6,161,077 A | * | 12/2000 | Fawcett | ...................... 324/523 |

* cited by examiner

Primary Examiner—N. Le
Assistant Examiner—James Kerveros

(74) Attorney, Agent, or Firm—Michael M. Ricken, Esq.

(57) ABSTRACT

A method and system for identifying, the cause of a partial discharge occurring in an electric system, which method increases measuring a variable of the electric system, such as voltage or current, to which partial discharges occurring in the electric system cause pulses, separating the pulses caused by partial discharges, i.e. partial discharge pulses, and occurring in the measured variable, defining and storing pulse parameters depicting the partial discharge pulses, or information from which the pulse parameters can be derived, defining (301) one or more pulse group graphs by means of the pulse parameters after at least a predefined number of partial discharge pulses, i.e. a pulse group, has been obtained, defining (302) one or more characteristic parameters from said at least one graph, and determining (304, 305) the cause of the partial discharge by means of the defined characteristic parameters and a reference library (600) formed in advance, which library describes one or more partial discharge causes, the reference library comprising one or more descriptions which correspond to partial discharge causes described by means of one or more membership functions of fuzzy logic, and for each characteristic parameter to be used, there is a corresponding membership function, and the step (304, 305) of determining the cause of the partial discharge comprises the steps of placing (304) the defined characteristic parameters into the membership functions corresponding to the characteristic parameters of each description in the reference library and calculating the values of the membership functions, and defining (305) the cause of the partial discharge on the basis of the values of the membership functions.

20 Claims, 16 Drawing Sheets

| | 1 | 2 | 3 | 4 | 5 | 6 | 7 | 8 | 9 | 10 | 11 | 12 | ... |
|---|---|---|---|---|---|---|---|---|---|---|---|---|---|
| 1 | 0 | 2-1 | 3-1 | 4-1 | 5-1 | 6-1 | 7-1 | 8-1 | 9-1 | 10-1 | 11-1 | 12-1 | ... |
| 2 | 0 | 0 | 3-2 | 4-2 | 5-2 | 6-2 | 7-2 | 8-2 | 9-2 | 10-2 | 11-2 | 12-2 | ... |
| 3 | 0 | 0 | 0 | 4-3 | 5-3 | 6-3 | 7-3 | 8-3 | 9-3 | 10-3 | 11-3 | 12-3 | ... |
| 4 | 0 | 0 | 0 | 0 | 5-4 | 6-4 | 7-4 | 8-4 | 9-4 | 10-4 | 11-4 | 12-4 | ... |
| 5 | 0 | 0 | 0 | 0 | 0 | 6-5 | 7-5 | 8-5 | 9-5 | 10-5 | 11-5 | 12-5 | ... |
| 6 | 0 | 0 | 0 | 0 | 0 | 0 | 7-6 | 8-6 | 9-6 | 10-6 | 11-6 | 12-6 | ... |
| 7 | 0 | 0 | 0 | 0 | 0 | 0 | 0 | 8-7 | 9-7 | 10-7 | 11-7 | 12-7 | ... |
| 8 | 0 | 0 | 0 | 0 | 0 | 0 | 0 | 0 | 9-8 | 10-8 | 11-8 | 12-8 | ... |
| 9 | 0 | 0 | 0 | 0 | 0 | 0 | 0 | 0 | 0 | 10-9 | 11-9 | 12-9 | ... |
| 10 | 0 | 0 | 0 | 0 | 0 | 0 | 0 | 0 | 0 | 0 | 11-10 | 12-10 | ... |
| 11 | 0 | 0 | 0 | 0 | 0 | 0 | 0 | 0 | 0 | 0 | 0 | 12-11 | ... |
| : | : | : | : | : | : | : | : | : | : | : | : | : | :... |

Fig. 20

METHOD AND SYSTEM FOR IDENTIFYING CAUSE OF PARTIAL DISCHARGES

BACKGROUND OF THE INVENTION

The invention relates to a method of identifying the cause of a partial discharge occurring in an electric system.

The voltage strength of an insulating structure refers to its ability to endure voltage stress without electric discharges that cause disturbances or damage. If the voltage stress in an the insulating structure is increased sufficiently, discharge occur which make the insulation completely or partially conductive. The latter are called partial discharges. A partial discharge does not unite the electrodes and, thus, the insulating properties of the insulating material do not completely disappear. Partial discharges do, however, wear the insulating material and thus further weaken its voltage strength and may finally lead to a complete electric discharge.

Partial discharges can be divided into two main groups, internal and external discharges. Internal discharges comprise cavity discharges and external discharges comprises surface, corona and spark discharge. Each group can further be divided into several subgroups which are often difficult to clearly distinguish from each other.

Partial discharge pulses are very fast pulses and usually occur as pulse groups. A partial discharge and the reversal of charge that occurs in connection with it show as a current pulse in the connectors of the insulating material. In practice, these current pulses also sum into the phase voltage of the system. Characteristics of partial discharges can be divided into two groups as follows: properties of a single partial discharge pulse, such as shape and charge, and properties of a partial discharge pulse group, such as pulse repetition frequency and pulse occurrence areas. Different partial discharge types have different partial discharge characteristics. By means of these characteristics, it is possible to identify different partial discharge types and consequently, the cause of the partial discharge. It is important to identify the cause of a partial discharge when, for instance, estimating the disturbance caused by the discharges or their location. The concept of a partial discharge cause should, in this context, be understood widely and can mean not only a defect causing partial discharges, but also a certain development stage of such a defect. The cause of partial discharges is not necessarily even an actual defect, but partial discharges may be generated in connection with the normal operation of an electric system without any special structural defect within the system, for instance.

EP Application 572 767 A3 [1] discloses equipment for detecting defects or abnormal situations in a monitored apparatus (e.g. an electric apparatus) and for determining the cause of the defect. The operation of the equipment is based on the use of a neural network in analysing a measuring signal. The measuring signal is a signal coming from an acceleration or ultrasound transducer.

EP Application 488 719 A3 [2] discloses a method and system for detecting and identifying partial discharges in gas-insulated switchgears. The method is based on measuring and analysing phase difference between high-frequency partial discharge pulses and fundamental-frequency phase voltage zero points.

IEEE Transaction on Electrical Insulation, Vol, 28, No. 6, December 1993, pp. 917 to 973, F. H. Kreuger, E. Gulski, A. Krivda: "Classification of Partial Discharges" [3] discloses a method of classifying partial discharges. The type definition of partial discharges is done by forming statistical distributions of partial discharge pulses and defining descriptive characteristic parameters therefrom. The identification is done by comparing the defined characteristic parameters with pre-defined characteristic parameters describing known partial discharges.

The drawbacks of the prior art equipment disclosed in the publication [1] relate to the use of the neural network technology. Training a neural network to operate reliably requires the collection of a large amount of measurement data on each identifiable defect, which covers sufficiently extensively different situations. Collecting such an amount of measurement data on condition monitoring of an electric network, for instance, is time-consuming and expensive. Certain neural network types also have the tendency to classify unknown defects as one of the known defect types (defined on the basis of the training data), which increases the number of wrong alarms undermining the credibility of condition monitoring.

A drawback of the prior art method disclosed in the publication [2] is that it does not take into consideration the statistical behaviour of partial discharges pulses, the apparent charge data of pulses or the correlation between consecutive pulses. Therefore, the classification accuracy of the method is not necessarily adequate for each purpose.

In a reference defect library of the prior art method disclosed in the publication [3], the tolerances set for the characteristic parameters of different defect types are strict, i.e. when comparing the characteristic parameter of a measured discharge with those in the defect library, the fact how accurately the value of the characteristic parameter is within the tolerances defined for the defect in the library (or how far outside thereof it is) is not taken into consideration. Strict limitations decrease the classification capability of the system, and physically, there are no grounds for defining strict limitations. In addition, all characteristics parameters in the method described in the publication are equal regardless of how well they can classify defects.

BRIEF DESCRIPTION OF THE INVENTION

It is thus an object of the invention to develop a method and a system implementing the method so as to solve the above-mentioned problems. The object of the invention is achieved by a method and system characterized in what is stated in the independent claims 1 and 18. Preferred embodiments of the invention are disclosed in the dependent claims.

The invention is based on the idea that the cause of partial discharges in the system is identified by means of partial discharge pulses by using fuzzy logic. According to the invention, one or more characteristic parameters are defined for partial discharge pulses and the characteristic parameters are compared with defined reference values described by means of fuzzy logic membership functions, the values representing known causes for partial discharges. According to a preferred embodiment of the invention, when there are at least two defined characteristic parameters, weighting coefficients corresponding to the characteristic parameters are also used in determining the cause of a partial discharge, each weighting coefficient depicting the ability of the corresponding characteristic parameter to distinguish from each other the causes of a partial discharge described in the reference library, i.e. the characteristic parameters are weighted according to their classification capability.

The method and system of the invention provide the advantage that a relatively small amount of measurement data is needed in comparison with using a neural network, for instance. In addition, the reliability of the identification of the method and system of the invention is better than when using a neural network, if the reference library is formed on the basis of a small amount of measurement data. The invention can easily be applied to condition monitoring of various apparatuses and environments, such as different electric networks, by altering the reference library to correspond to the typical defects of the environment being examined and by checking the possible weighting coefficients. Further, the invention enables the utilisation of empirical data in forming the membership functions. In addition, the number of various identifiable defects is not limited.

BRIEF DESCRIPTION OF THE FIGURES

In the following, the invention will be described by means of preferred embodiments and with reference to the attached drawings in which

Figure 20:
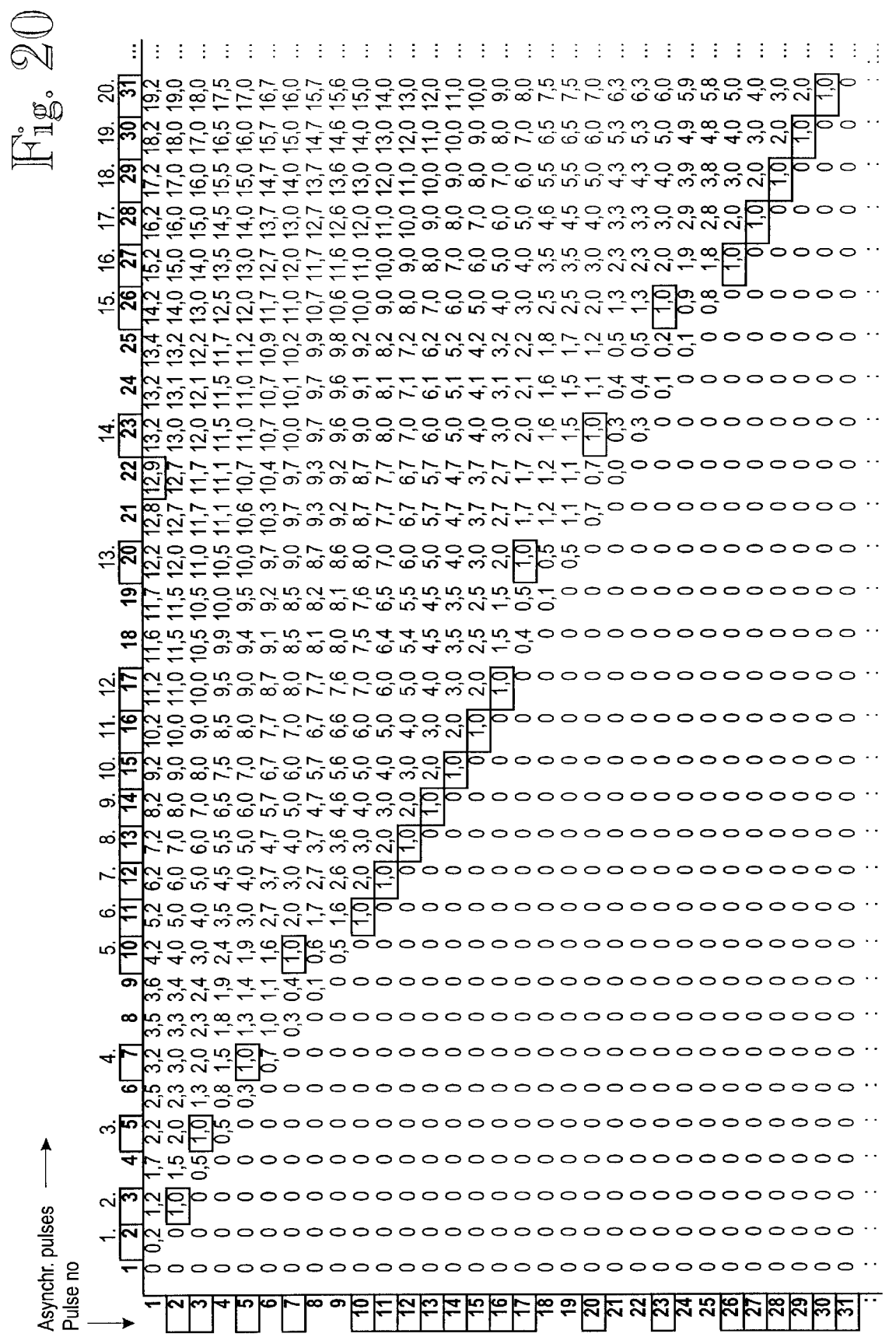

FIG. 20 shows an example of a time difference matrix.

DETAILED DESCRIPTION OF THE INVENTION

Figure 22:
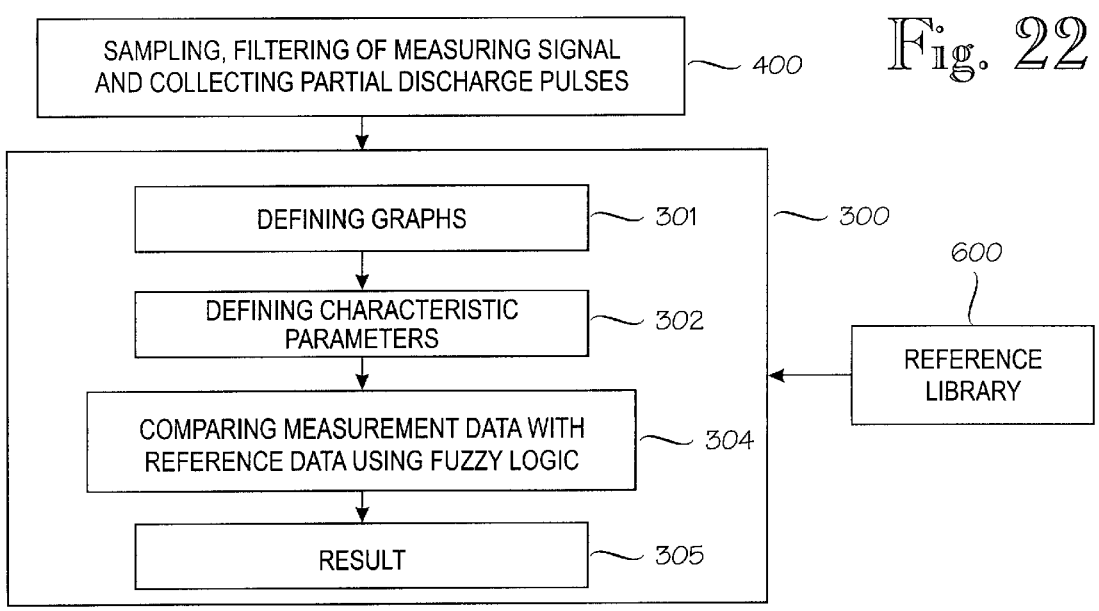
FIG. 22 shows a block diagram of a system of the invention according to an embodiment thereof.

A block diagram of a method and system of the invention is shown in FIG. 22. The invention can be divided into two main blocks: sampling, measuring signal filtering and partial discharge pulse collection 400 and partial discharge pulse analysis 300. In addition, the system comprises a reference library 600. FIG. 22 also shows the operation of the analysis block 300 illustrated by means of a flow chart. The use of the method and system of the invention is not limited to any specific system, but they can be used in connection with various electric systems, such as electric networks or apparatuses, to identify causes of partial discharges occurring in them. The system of the invention can be implemented by means of digital signal processing equipment, for instance.

Figure 23:
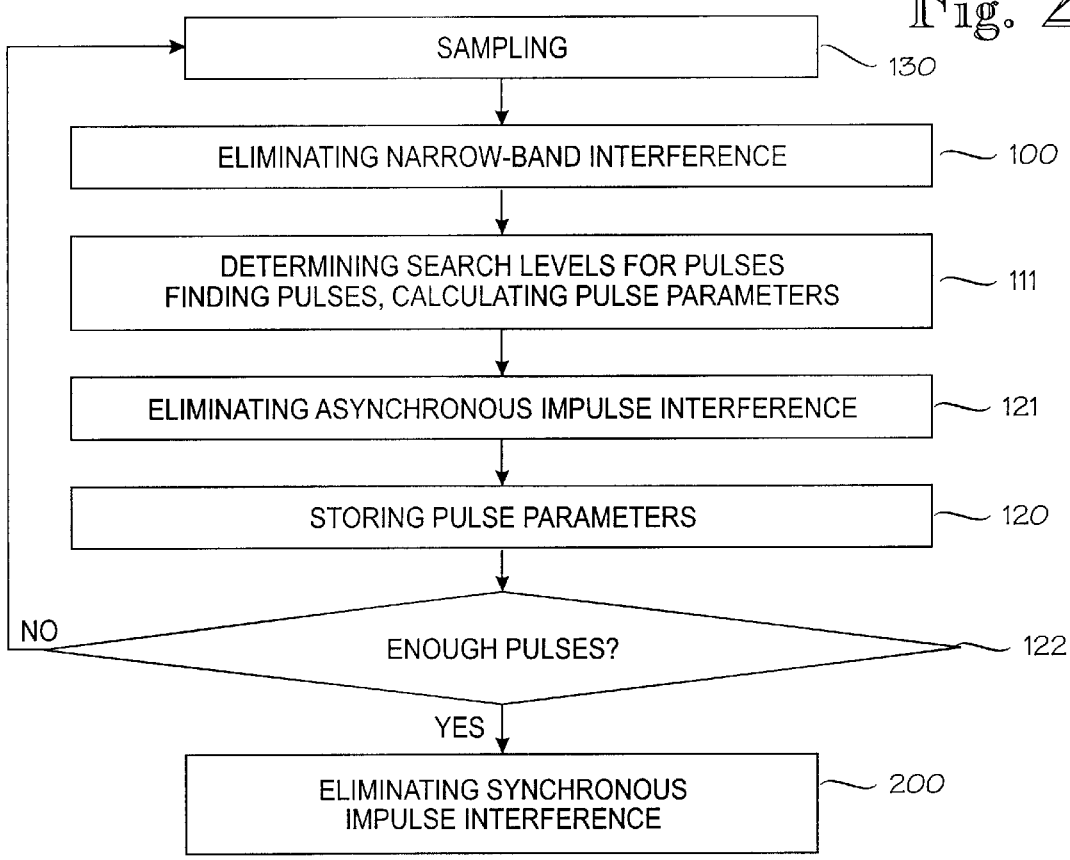
FIG. 23 shows a block diagram of a sampling, measuring signal filtering and partial discharge pulse collection according to an embodiment thereof.

FIG. 23 shows a flow chart illustrating the operation of the sampling, measuring signal filtering and partial discharge pulse collection block 400 according to an embodiment thereof. In the method, a high-frequency voltage (or another variable from which partial discharge pulses can be distinguished) occurring in an electric network is preferably continuously digitised during several network cycles. The used measurement method bears no significance to the basic idea of the invention and depends, for instance, on the electric system being examined. The lower limiting frequency $f_l$ is a few tens of kilohertz, for instance, and the upper limiting frequency $f_u$ is several megahertz, for instance (e.g. $f_l \approx 60$ Hz and $f_u \approx 8$ MHz). The digitising results 130 at a sampling frequency of 16 MS/s, for instance, in a total of 960,000 samples during three network cycles. This three-cycle packet is in the following called a measurement and it is also the input data of an algorithm. The algorithm preferably eliminates 100, 121, 200 interfering signals from the measurement using digital filtering, for instance. The algorithm picks partial discharge pulses from the sample string remaining in the measurement. From the pulses, the algorithm calculates 111 for instance the following parameters depicting the pulse form and the temporal location of the pulse with respect to the voltage (nominal frequency, e.g. 50 or 60 Hz): peak value of the pulse, area of the pulse, rise time of the pulse (preferably 10 to 90% points), fall time of the pulse (preferably 90 to 10% points), width of the pulse (preferably at a height of 50%), starting phase angle of the pulse, sequence number of the network cycle (where the pulse occurred) and the time stamp of the starting time of the network cycle (where the pulse occurred). The above-mentioned pulse parameters are stored 120 of analysis for each pulse.

Alternatively, it is possible to store the following information, for instance, on each pulse: 50 to 100 sample points of each pulse, the starting phase angle of the pulse, the sequence number of the network cycle (where the pulse occurred) and the time stamp of the starting time of the network cycle (where the pulse occurred). In this alternative case, the pulse parameters mentioned earlier are calculated only in the analysis block 300.

It should be noted that the filtering of the measuring signal and the collection of the partial discharge pulses can also be performed utilising other methods without this having any significance with respect to the basic idea of the invention. It is also possible that only a part of the presented filtering methods are used or that no filtering is needed, if the system being examined is protected against external interference.

One interference type related to partial discharge measurements is narrow-band interference. Narrow-band interference refers to interfering signals whose spectrum is narrow, i.e. the energy of the signal is concentrated on a narrow frequency range. Various radio transmitters and communications equipment operating on a narrow frequency range typically cause narrow-band interference. This type of interference may mask weak partial discharge pulses, thus weakening the sensitivity of the partial discharge measurement. Another interference type related to partial discharge measurements is asynchronous impulse interference which is a pulse-form interference and does not occur synchronously with a phase voltage (nominal frequency, e.g. 50 or 60 Hz), in other words, in consecutive phase voltage cycles, the pulses do not occur at the same phase angles. The time between consecutive interfering pulses remains almost constant, however. Commutating pulses of an inverter are a typical example of asynchronous impulse interference. A third interference type related to partial discharge measurements is synchronous impulse interference which is a pulse-form interference and occurs synchronously with a phase voltage. Interfering pulses repeat in consecutive cycles at nearly constant phase angles. In addition, the amplitude of the pulses remains nearly constant. Synchronous impulse interference is caused by commutating pulses of rectifiers and phase angle regulation, for instance.

Eliminating narrow-band interference 100

Figure 4:
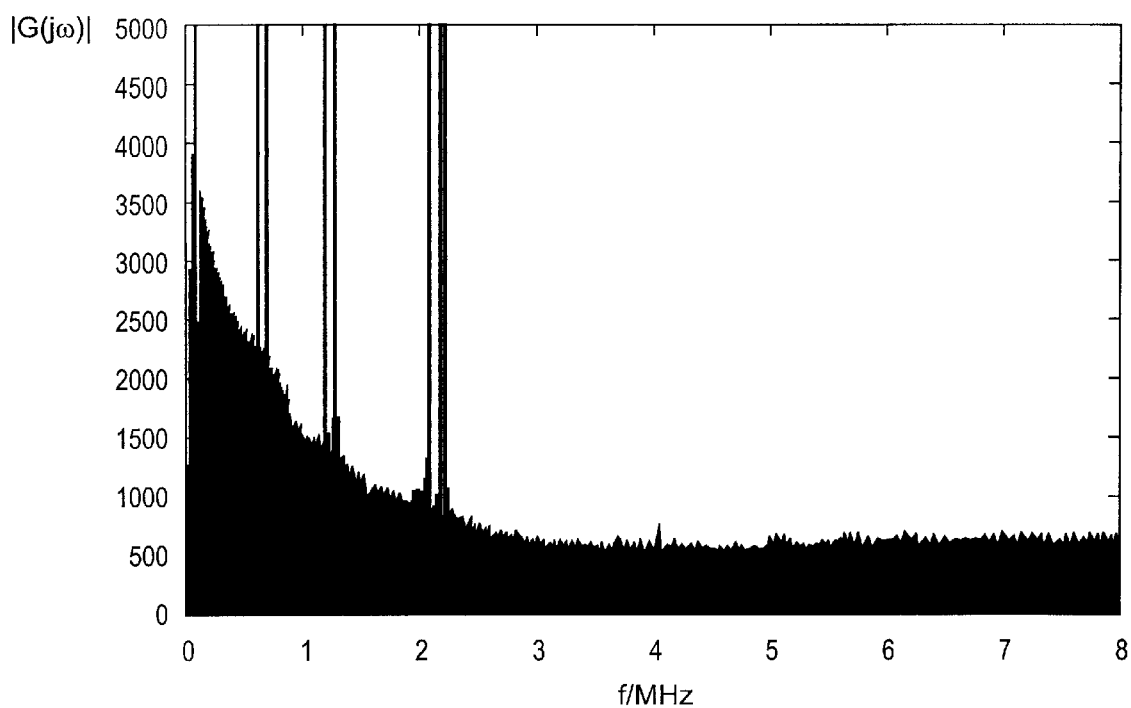
FIG. 4 shows the amplitude spectrum of the exemplary signal scaled in relation to the amplitude.

Narrow-band interference is shown as peaks in the amplitude spectrum. The width of the peak is directly proportional to the width of the interference band. To be able to eliminate narrow-band interference from a signal, one must be able to identify from the amplitude spectrum any peaks occurring in it. The power of partial discharges and noise is evenly distributed along the entire frequency range of the spectrum. The amplitude spectrum of white noise is according to its specification constant on the entire frequency range. With coloured noises, the power is higher on some frequency ranges, but even these cases show as planar areas in the amplitude spectrum. In the tests performed with the measuring system used as an example in the application, the applicant has noticed that the power of partial discharges is distributed along the entire frequency range in the spectrum. Partial discharges do, however, have more power at low frequencies than at high frequencies. For instance FIG. 4, which discloses the amplitude spectrum $|G(j\omega)|$ of the exemplary signal $G(j\omega)$ scaled in relation to the amplitude, shows that the power of the partial discharges is higher at the frequency range 0 to 2.5 MHz and at the frequency range 2.5 to 8 MHz, the power is nearly constant. The peaks shown in FIG. 4 are caused by narrow-band interference. Narrow-band interference has in the example of FIG. 4 concentrated on low frequencies, but in practice, they may occur on the entire frequency range.

Figure 1:
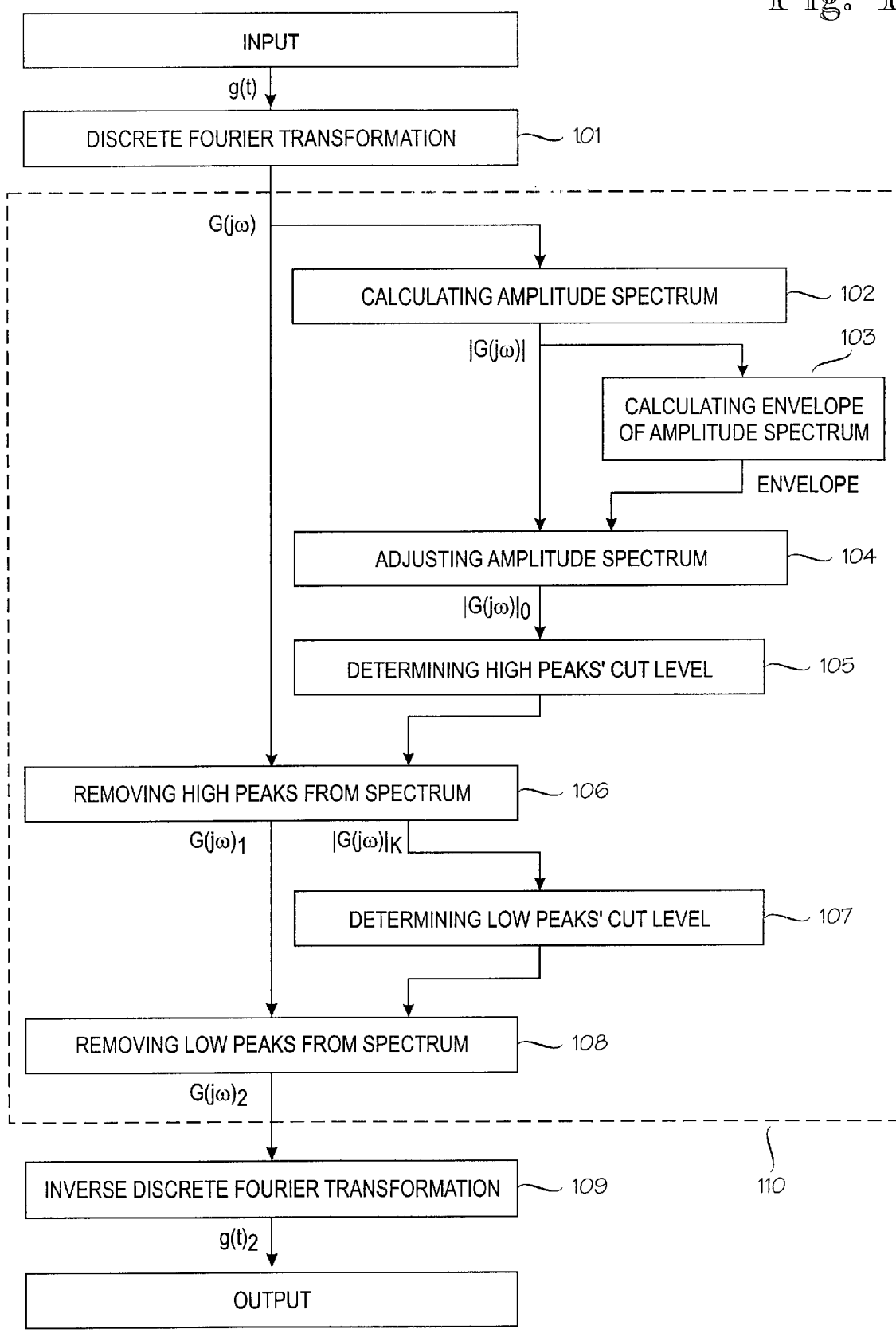
FIG. 1 shows a block diagram of a method of eliminating narrow-band interference.

A block diagram illustrating a method of eliminating narrow-band interference is shown in FIG. 1. The method is based on modifying 110 a finite-length signal in a frequency domain. For this purpose, before the signal is modified, it is transformed 101 from a time domain (g(t), where t is time) to a frequency domain ($G(j\omega)$, where j is an imaginary unit and $\omega=2\pi f$, where f is the frequency) in time intervals of suitable length, preferably by Fourier transformation. After the time interval of the signal has been modified, it is returned 109 to the time domain by a reverse Fourier transformation. The examples use a 60 ms-long signal time interval at a 16 MHz sampling frequency, whereby a total of 960,000 sample points are obtained. The length of the signal time interval may differ from the above exemplary value.

Figure 2:
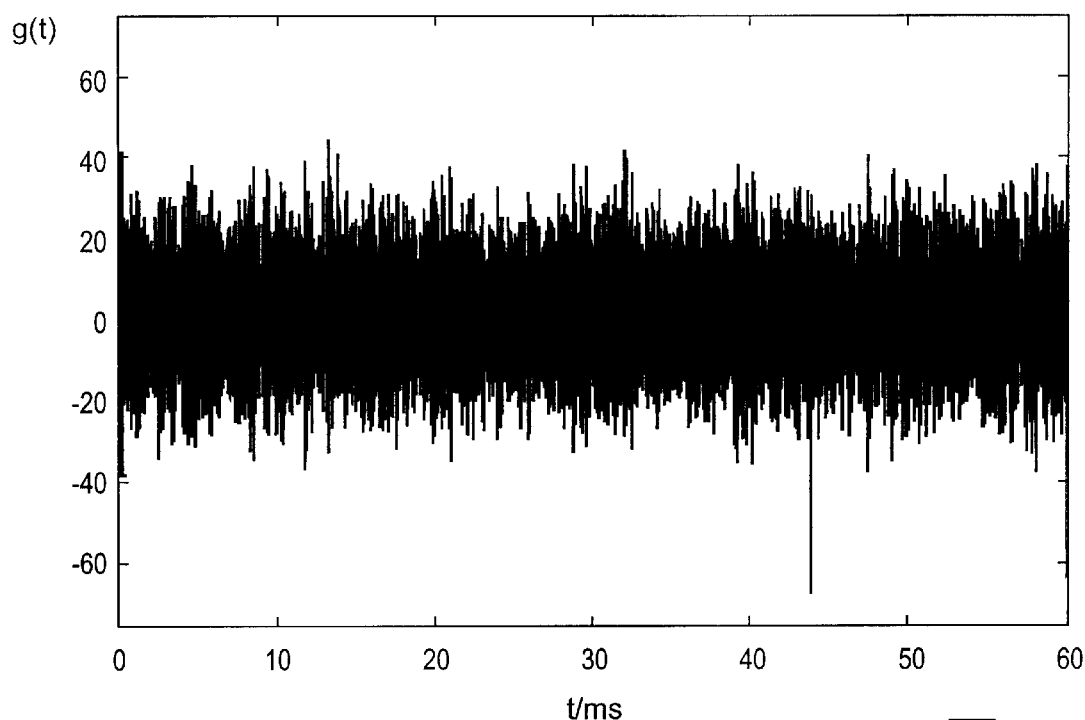
FIG. 2 shows an interfering exemplary signal in a time domain.
Figure 3:
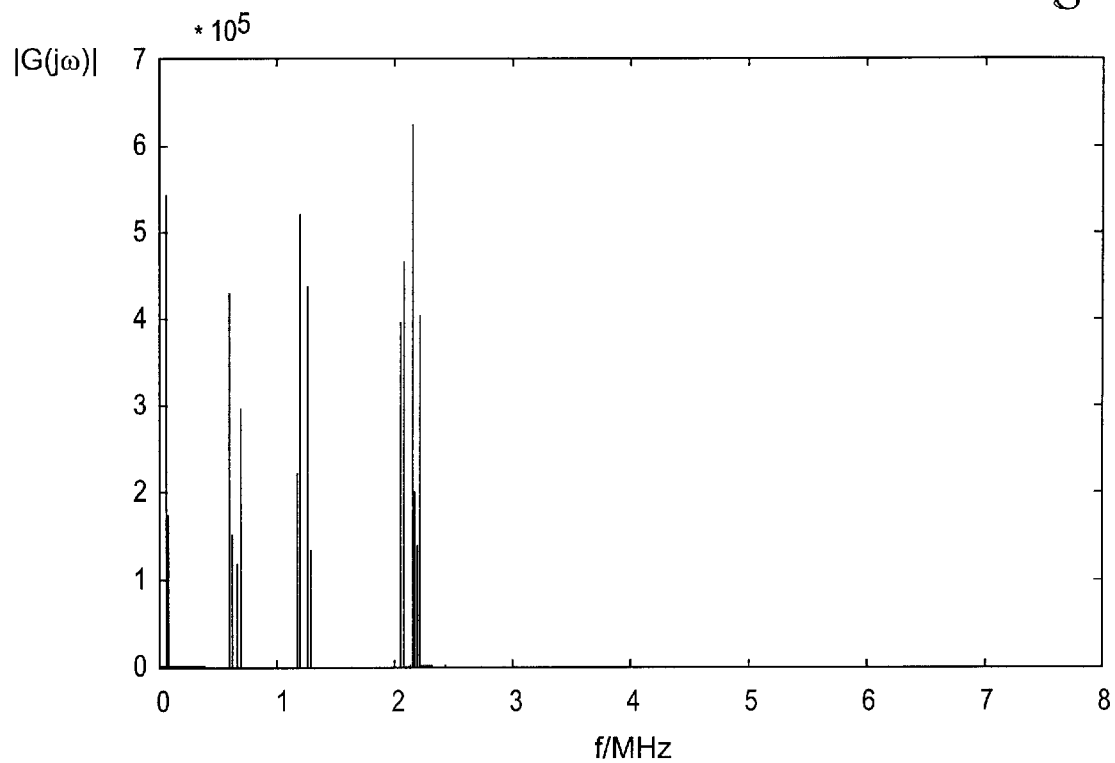
FIG. 3 shows an amplitude spectrum of the exemplary signal.
Figure 5:
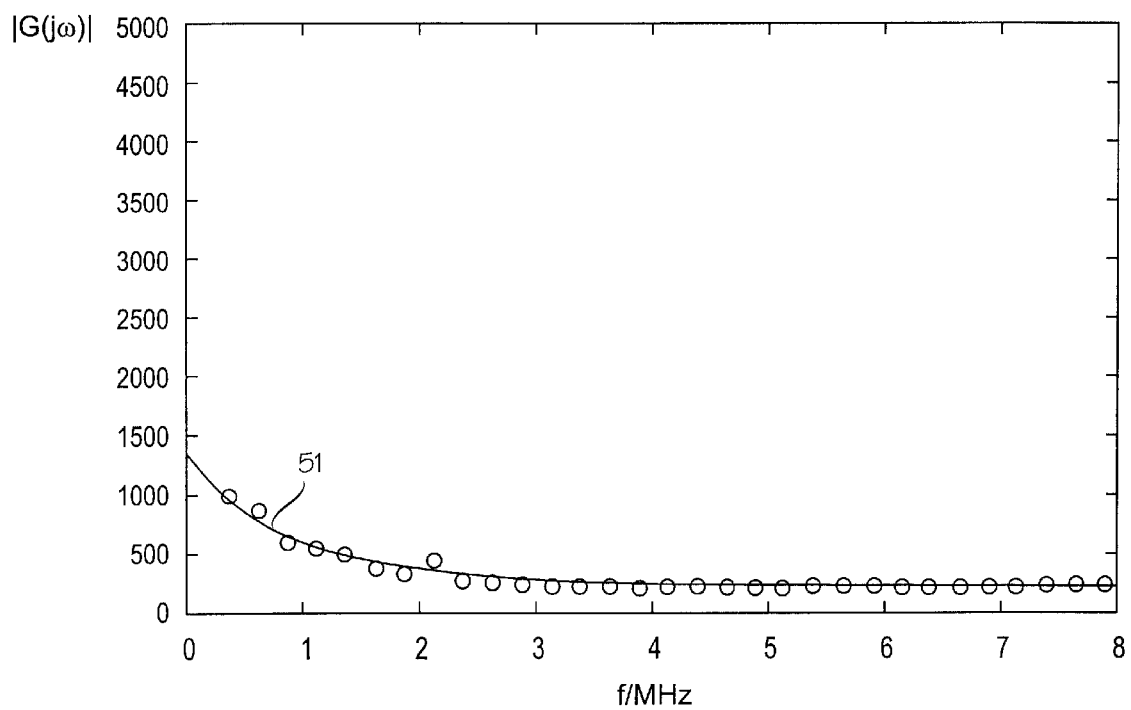
FIG. 5 shows sectional medians of the amplitude spectrum and an envelope adapted to them.

FIG. 2 shows the exemplary signal g(t) in a time domain, wherein the vertical axis depicts the signal amplitude g(t) and horizontal axis the time t. It should be noted that the graphs shown in FIGS. 2 to 10 only describe one exemplary signal and they are intended only to illustrate the operation of a filtering method. The amplitude spectrum $|G(j\omega)|$ (FIG. 3), which depicts the signal amplitude $|G(j\omega)|$ (vertical axis) in relation to the frequency f (horizontal axis), is calculated 102 from the Fourier spectrum of the signal transformed into the frequency domain, i.e. the spectrum $G(j\omega)$. FIG. 4 shows the amplitude spectrum $|G(j\omega)|$ scaled in relation to the amplitude. If one tries to identify the peaks of narrow-band interference from an amplitude spectrum $|G(j\omega)|$ like that of FIG. 4, it may happen that a strong power peak of a partial discharge occurring in the frequency range 0 to 1 MHz, for instance, is interpreted as an interference peak. If, due to this, the frequency range 0 to 1 MHz is filtered away completely, a considerable amount of power is removed from the partial discharge signal. This results in the distortion of partial discharge pulses and the filtering result cannot be used. To avoid the above problem, the amplitude spectrum $|G(j\omega)|$ of the signal is adjusted. The adjustment is done by finding the envelope of a uniform bottom level of the amplitude spectrum. In the case of FIG. 4, the uniform area at the bottom of the amplitude spectrum can be considered the bottom level. Peaks do not belong to the bottom level. For defining the bottom level envelope of the amplitude spectrum, the amplitude spectrum is divided into sections, for instance 32 sections, and a median is defined for each section. The first of the 32 sectional medians is preferably left out, if in sampling, the measuring signal was high-pass filtered to remove the main voltage and harmonics, in which case the median of the first section does not represent the actual form of the envelope. The envelope is obtained 103 by matching to these 31 points (circled values in FIG. 5) for instance an exponential third degree polynome 51 to form envelope=$e^{ax^3+bx^2+cx+d}$, wherein a, b, c and d=coefficients of the polynome, e=Neper number, and x=frequency.

Figure 6:
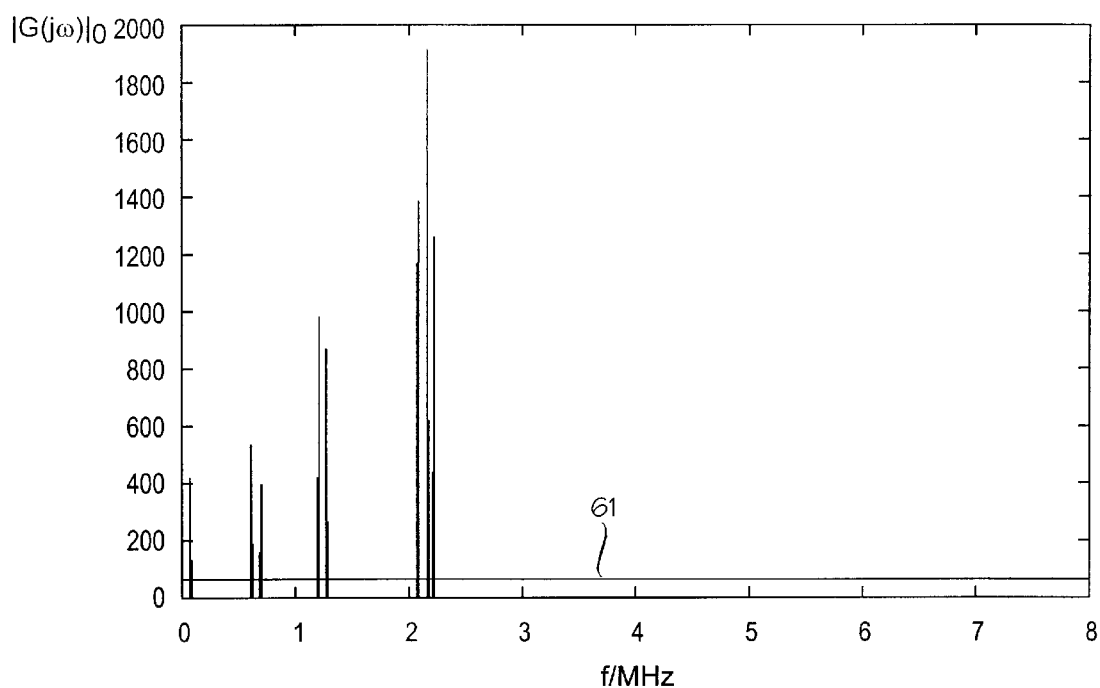
FIG. 6 shows an adjusted amplitude spectrum and a cut level of high peaks.
Figure 10:
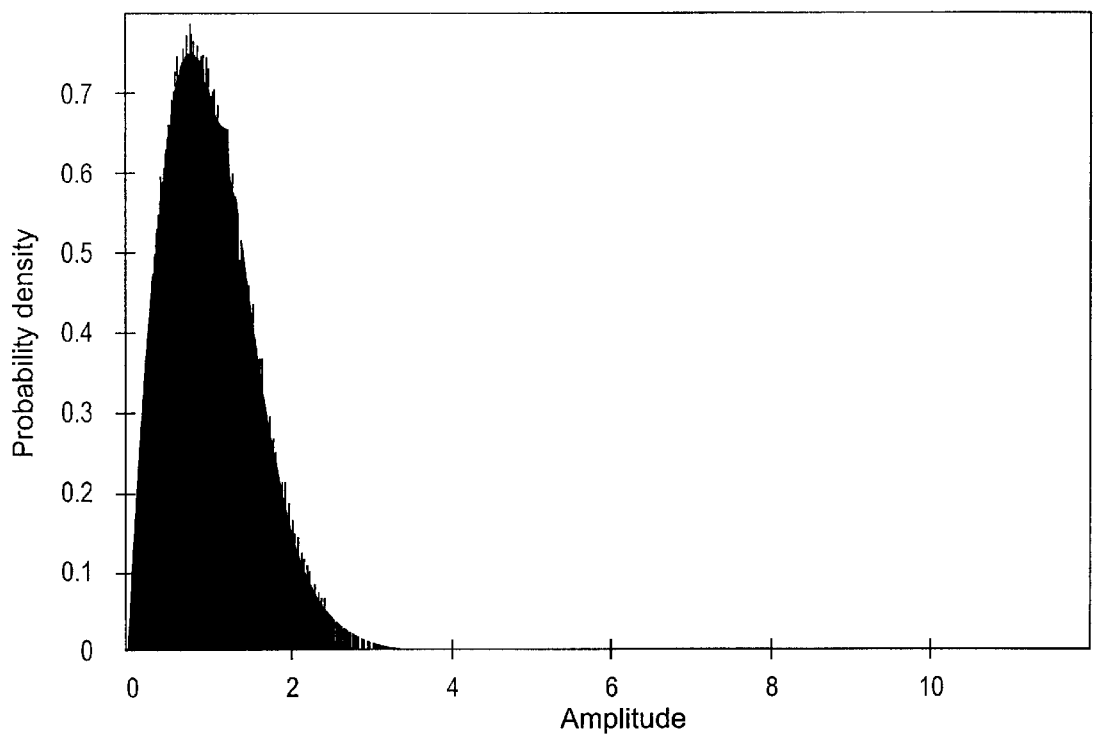
FIG. 10 shows the amplitude distribution of the adjusted amplitude spectrum.

The amplitude spectrum $|G(j\omega)|$ is adjusted 104 by dividing it by the envelope values sample by sample. The adjusted amplitude spectrum $|G(j\omega)|_o$ is shown in FIG. 6. In the adjusted amplitude spectrum, the bottom level is nearly constant and the peaks rising from it are narrow-band interference. Narrow-band interference peaks are easy to identify in an adjusted amplitude spectrum, if a bottom level has been defined. A simple solution would be to use a fixed cut level. The strength and density of partial discharges and the power of the background noise, and thus also the power of the entire signal, vary, however, thus also making the height of the bottom level of the amplitude spectrum to vary. When using a fixed cut level, the level should be set so high that one can be absolutely sure of not interpreting the bottom level, and, at the same time, the partial discharges, as interference. In this case, however, the sensitivity of interference elimination decreases, i.e. some of the interference is not eliminated. The most advantageous solution is to define the cut level case by case. The cut level must be set as low as possible, but clearly above the bottom level, however. An optimal cut level can be defined by means of the average and standard deviation or variance of an adjusted amplitude spectrum, for instance. The amplitude distribution of the adjusted amplitude spectrum is shown in FIG. 10, wherein the horizontal axis shows the amplitude value and the vertical axis the probability density of the amplitude value. The distribution resembles an $\chi^2$ distribution. There is a formula of an $\chi^2$ distribution, as there is one for a normal distribution, by means of which it is possible to estimate how large a part of the values is within the given limits. For instance, of the values of a normally distributed signal, 95% is within the limits $\mu \pm 1,96\sigma$ ($\mu$ is the average and $\sigma$ is the standard deviation). The formula of the $\chi^2$ distribution is in the same form as that of the normal distribution, but the probability limits offer. The cut level level of the spectrum peaks can be defined 105 and 107 by means of the average and standard deviation of the adjusted amplitude spectrum, for instance, by formula

*level=mean+coef.std, wherein* mean=the average of the adjusted amplitude spectrum, std=the standard deviation of the adjusted amplitude spectrum, and coef=the coefficient determining the sensitivity of the cut level.

The cutting of the spectrum peak is most preferably performed in two parts; first the possible high peaks are removed 106 and then the remaining low peaks are removed 108. By performing the cutting in two parts produces an exact and robust result. In addition, this ensures that partial discharges are not attenuated. In other words, the first cutting 106 endeavours to remove the high peaks which strongly affect the standard deviation, in which case, in the second cutting 108, the cut level level can be defined as exactly as possible above the bottom level. In the case of FIG. 10, for instance, an acceptable level value of the second cutting could be between 5 and 15. Alternatively, it is also possible to use only one cutting or more than two. If more than two cuttings were used, an even more exact and robust result would be achieved, but at the same time, the required calculation time would increase. When using only one cutting, the effect of the high peaks on the setting of the cut level is considerable. By a correct selection of the coefficient coef, it is possible to ensure that no filtering is done, if no narrow-band interference exists in the signal. In such a case, the cut levels are set so high that the entire amplitude spectrum remains below them. When defining 105 the cut levels of high peaks, the value coef=4 is preferably used, and when defining 107 the cut levels of low peaks, the value coef=3 is preferably used, when the cutting is done in two parts. Said values of the coefficient coef are based on tests performed by the applicant. Other values can also be used, but the most advantageous value range of the coefficient coef when calculating the first cut level is 3 to 6 and when calculating the second cut level, it is 2 to 4.

Figure 7:
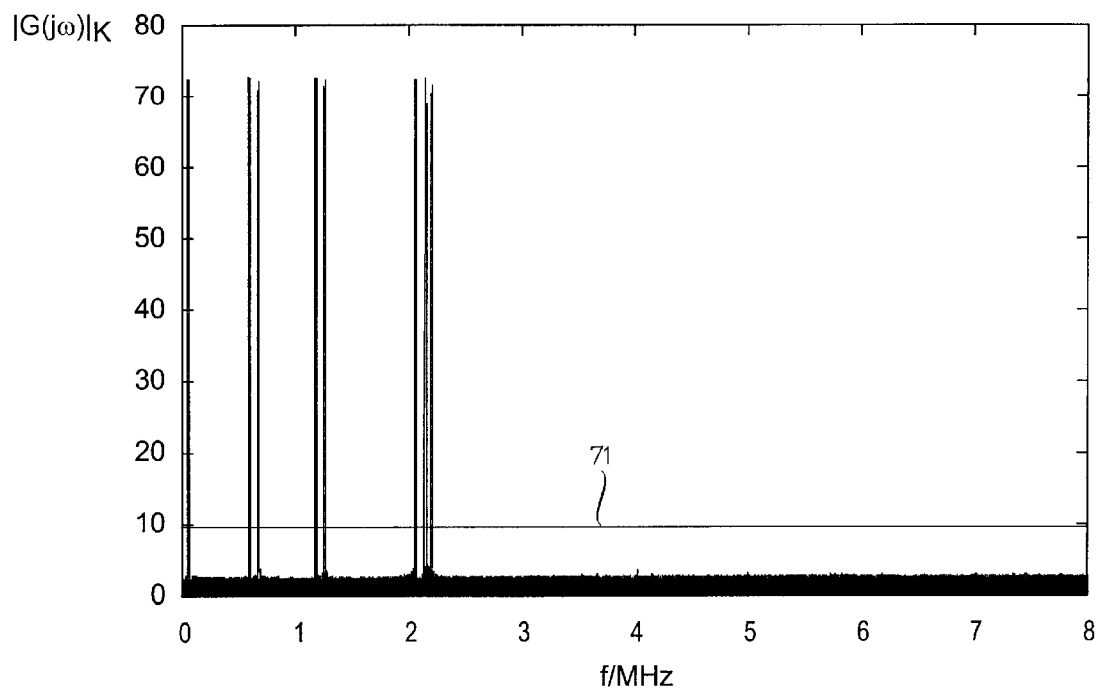
FIG. 7 shows a corrected adjusted amplitude spectrum and a cut level of low peaks.
Figure 8:
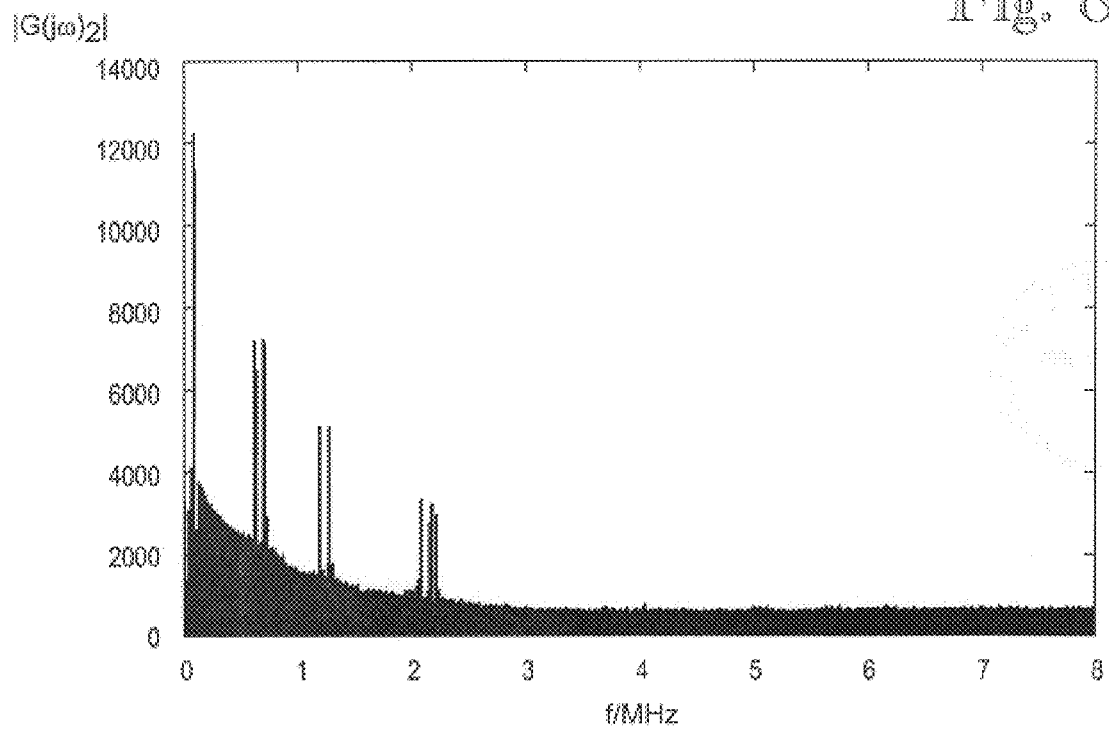
FIG. 8 shows the amplitude spectrum calculated from the corrected spectrum.
Figure 9:
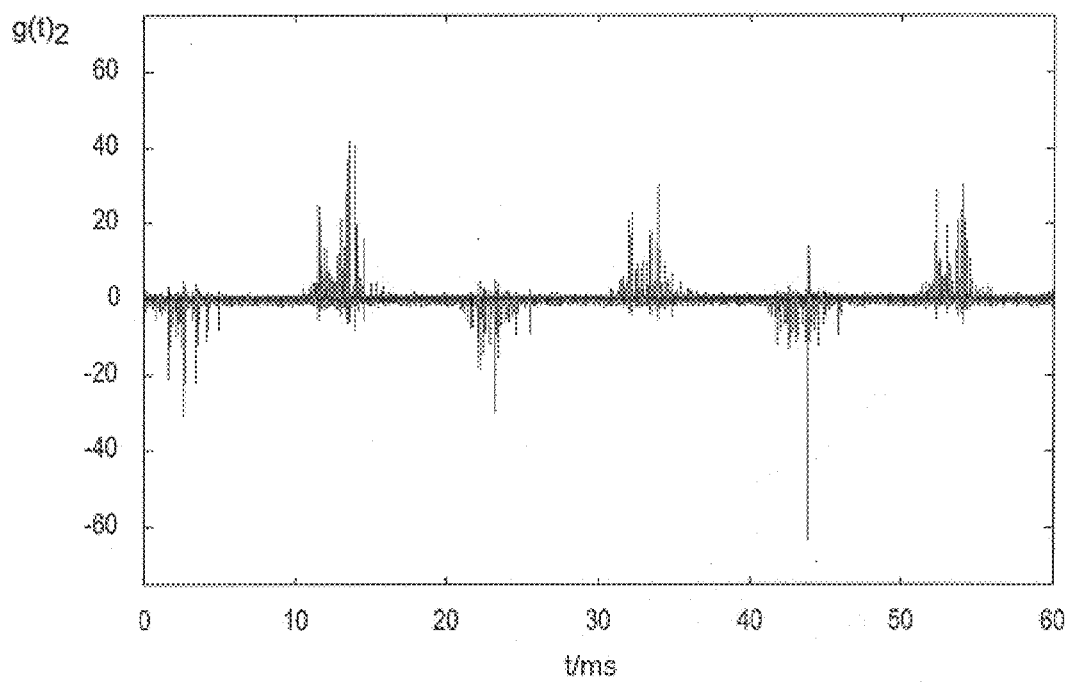
FIG. 9 shows the corrected exemplary signal in a time domain.

Removing the spectrum peaks from the spectrum is done at the first stage in such a manner that the frequency ranges having values exceeding the high peaks cut level 61 in the adjusted amplitude spectrum $|G(j\omega)|_o$ are nulled 106 in the spectrum $G(j\omega)$. Because the spectrum $G(j\omega)$ (like the amplitude spectrum) is discrete in relation to the frequency, i.e. it is made up of frequency samples, the smallest frequency range which can be nulled is a frequency range of the length of one frequency sample. Narrow-band interference does typically not, however, concentrate exactly point by point on one frequency, but may be slightly more widely spread. For instance, the bandwidth of an AM radio transmission including sidebands may be 9 kHz. Thus, the interference may be spread in the area of several frequency samples. Because of this, it may be advantageous that the frequency range to be nulled comprises not only the frequency sample in which the interference shows, i.e. the cut level is exceeded, but also one or more neighbouring frequency samples depending on the sampling frequency being used. For instance, at a 16 MHz sampling frequency and with a 960,000-point sample string, the width of one frequency sample corresponds to approximately 16.7 Hz. If the width of the interference to be removed is 9 kHz, the number of frequency samples to be nulled is 540, i.e. 270 samples on both sides of the sample exceeding the cut level. The result is the corrected spectrum $G(j\omega)_1$. FIG. 6 shows an adjusted amplitude spectrum $|G(j\omega)|_o$ and the first cut level 61. For defining 107 the cut level of low peaks, the amplitude values exceeding the cut level 61 are also nulled 106 in the adjusted amplitude spectrum, in which case block 107 used the corrected adjusted amplitude spectrum $|G(j\omega)|_k$ for defining the second cut level 71. The correction of the adjusted amplitude spectrum alters (makes smaller) its average and standard deviation, and the definition of the second cut level can be made more accurately in the second cutting. If more than two cuttings were used, the amplitude spectrum used in defining 105 and 107 the cut level would also be corrected correspondingly with each spectrum correction 106. The correction of the amplitude spectrum is not made with the last spectrum correction 108, because the amplitude spectrum will not be needed later. Removing 108 low peaks from the spectrum is done correspondingly, i.e. the frequency ranges having values exceeding the cut level 71 of the low peaks in the corrected adjusted amplitude spectrum $|G(j\omega)|_k$ are nulled in the corrected spectrum $G(j\omega)_1$. FIG. 7 shows the corrected adjusted amplitude spectrum and the second cut level 71. The result is thus the spectrum $G(j\omega)_2$ from which peaks have been removed at two different stages. The amplitude spectrum $|G(j\omega)_2|$ corresponding to this corrected spectrum $G(j\omega)_2$ is shown in FIG. 8. As a result of the filtering, low peaks caused by narrow-band interference often remain in the amplitude spectrum, bit if the width and height of the peak is taken into account, it can be noted that the power of the interfering pulse is very low. FIG. 9 shows the corrected signal $g(t)_2$ in a time domain, obtained by transforming 109 the twice corrected 106 and 108 spectrum, i.e. signal $G(j\omega)_2$ from the frequency domain back to the time domain. The narrow-band interference remaining in the signal are considerably lower than the background noise, so distinguishing interference in the time domain (FIG. 9) is almost impossible.

Eliminating Asynchronous Impulse Interference 121

The operation of a method of eliminating asynchronous impulse interference is based on the fact that the typical properties of a partial discharge pulse and asynchronous interfering pulses differ from each other enough to make distinguishing them possible. Partial discharge pulses occur in pulse groups in areas of cycle depending on the discharge type, and there is deviation in the location and amplitude of a single pulse, whereas asynchronous impulse interference occurs at almost equal intervals, at nearly a constant amplitude and during the entire cycle.

Figures 11, 13:
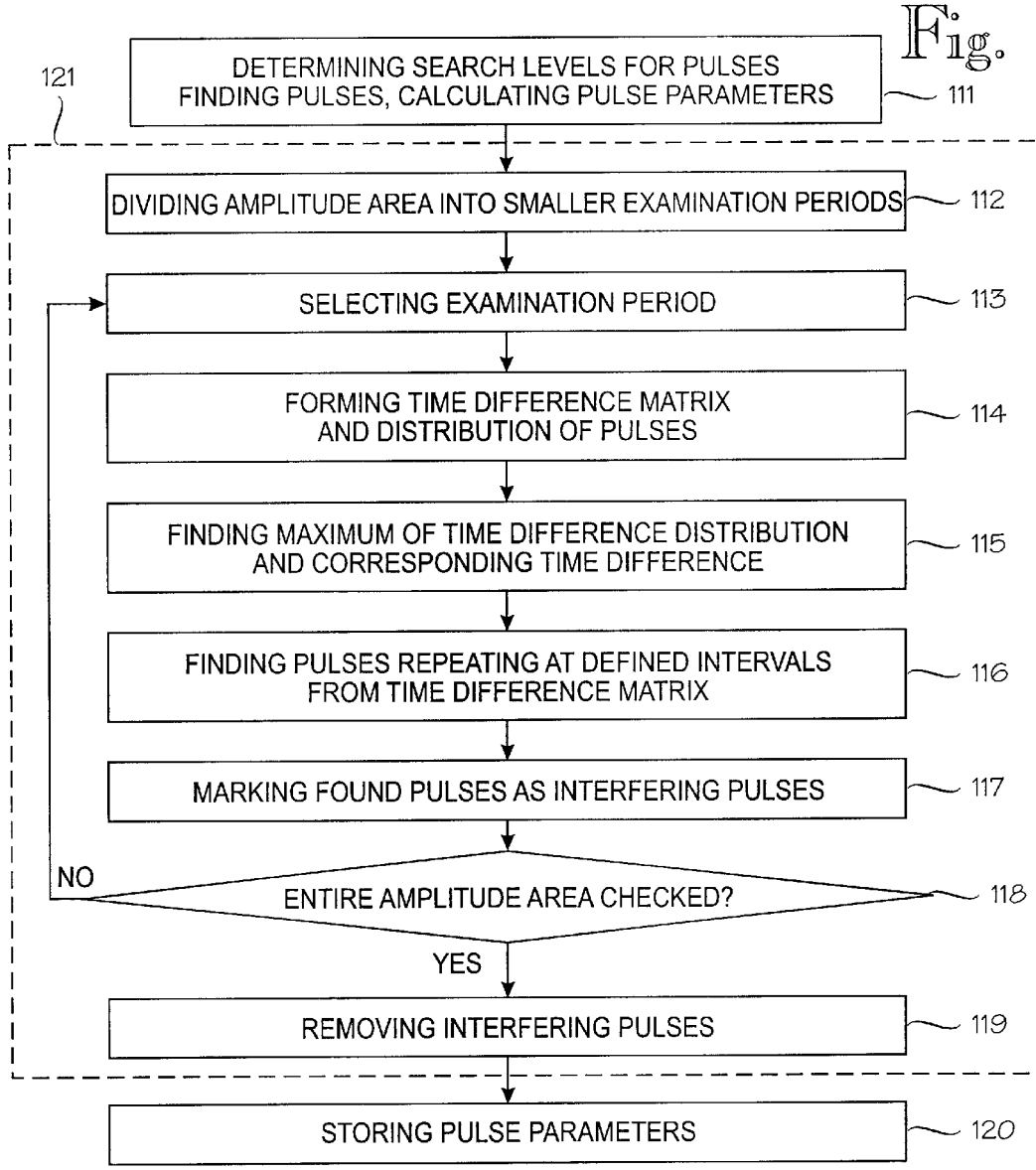
FIG. 11 shows a block diagram of a method of eliminating asynchronous impulse interference.
FIG. 13 shows the basic structure of a time difference matrix.

As stating data, the method uses pulse parameters obtained by finding the pulses occurring in a partial discharge measuring signal and calculating and storing the following information on them: pulse amplitude, starting phase angle and cycle number. In the measurements used as examples, data was measured during three network cycles (60 ms with 50 Hz frequency) and in the earlier phases, the amplitude of the pulses was scaled to between 0 and 128. No limits are set to the number of pulses. During one cycle, there are assumed to be 5 to 500 asynchronous interfering pulses and consequently, the time difference of consecutive interfering pulses is assumed to vary between 0.04 and 4 ms. The flow chart of the method is shown in FIG. 11.

Figure 14:
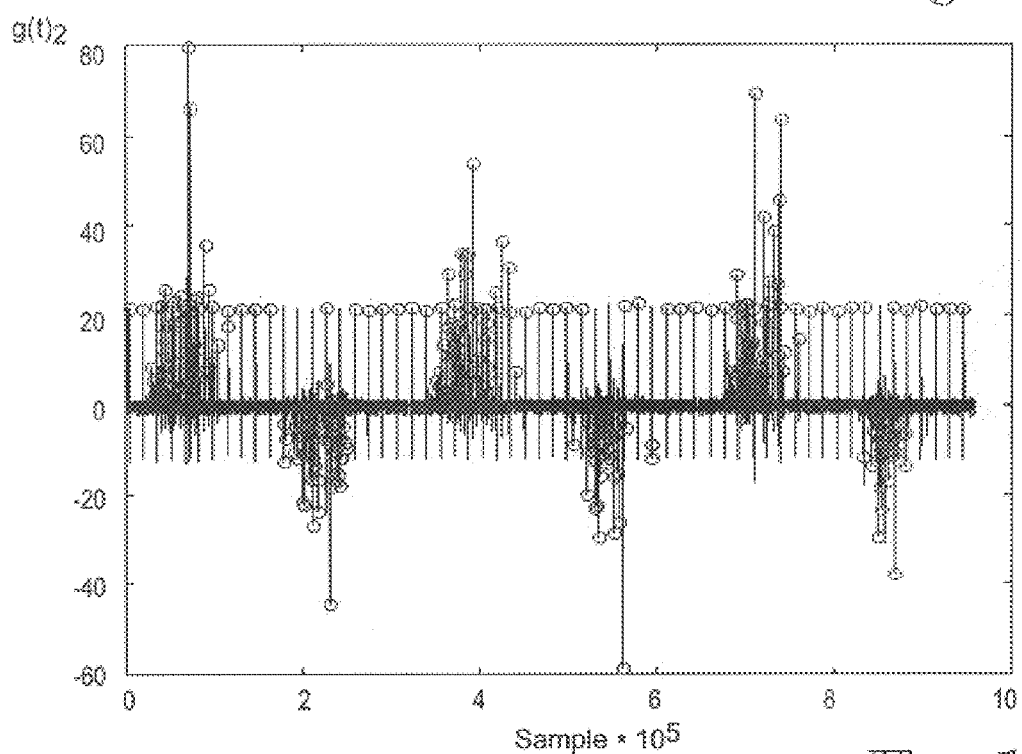
FIG. 14 shows an interfering exemplary signal.
Figure 15:
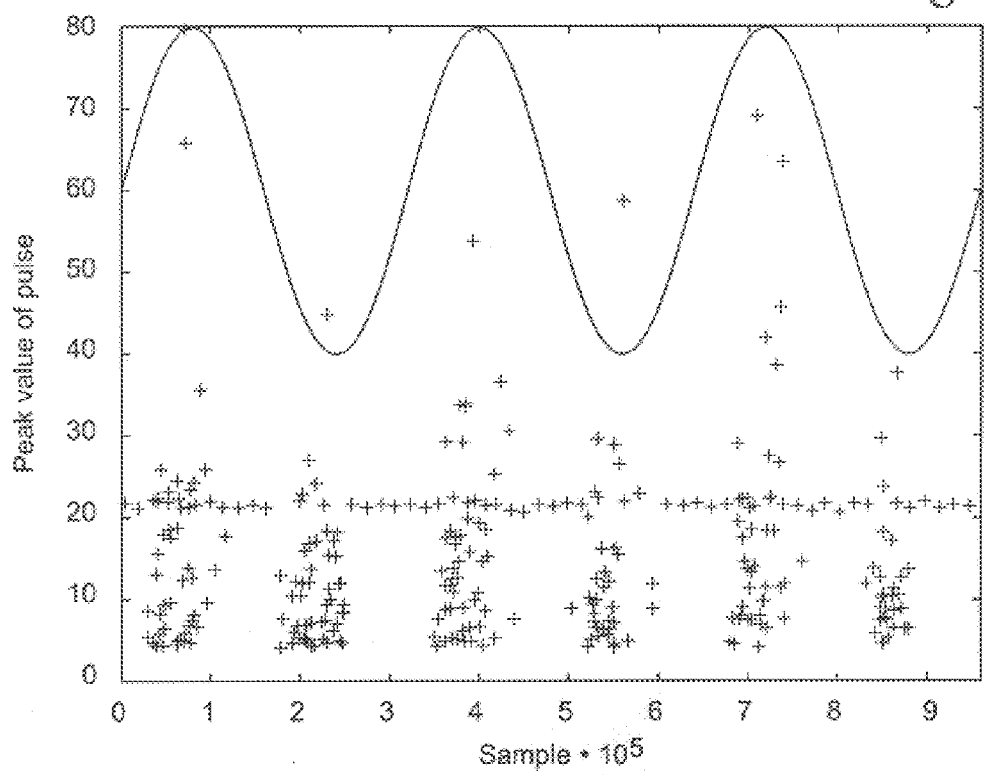
FIG. 15 shows the peaks detected in the exemplary signal.

At the pulse search and pulse parameter calculation stage 111, the pulses occurring in the measuring signal are found and pulse parameters (e.g. amplitude, phase angle and cycle number) are defined for the pulses. FIG. 14 shows a partial discharge measuring signal. The peaks of the pulses found in the signal have been circled. The pulse parameters of the found pulses are used as the starting data. FIG. 15 shows the peaks of the found pulses in time order. In FIGS. 14 and 15, the X axis represents the samples, and thus in the case described herein, one sample corresponds to 62.5 ns. FIG. 15 also shows a 50 Hz sine wave to illustrate the location of the pulses in the phase voltage more clearly. The string of asynchronous interfering pulses is shown in FIG. 15 as a string in the amplitude area 20 to 25.

Figure 12:
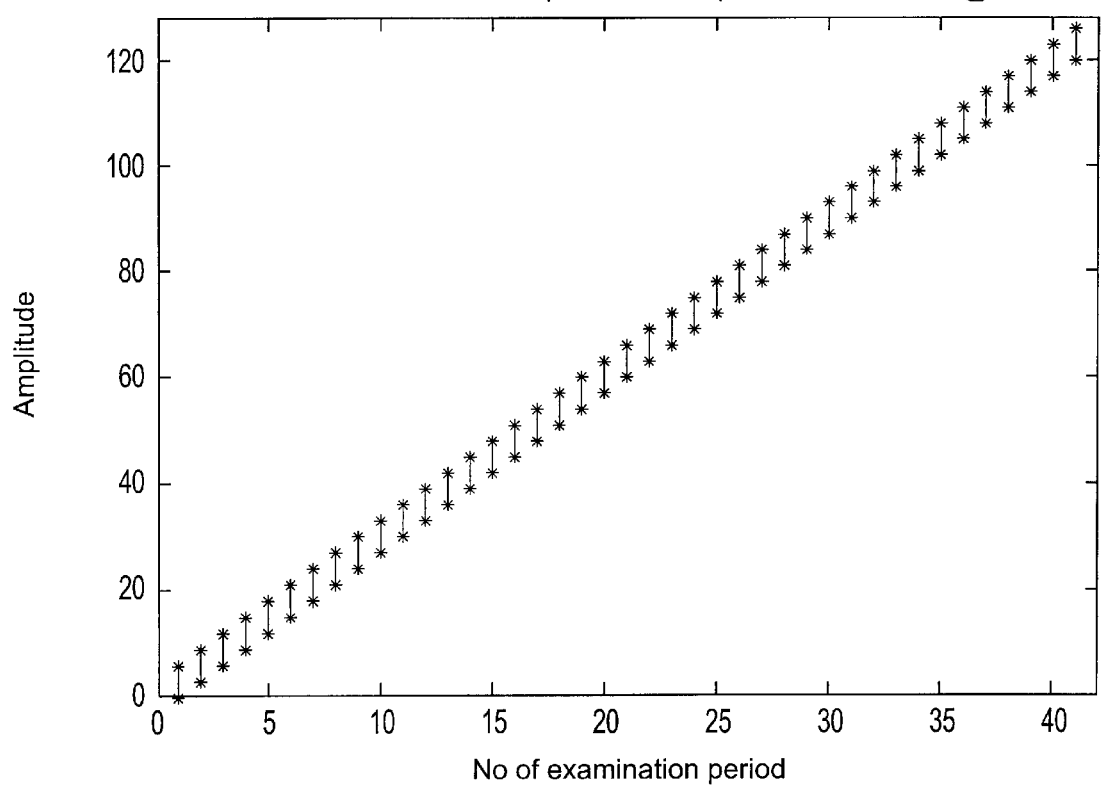
FIG. 12 shows the division of an amplitude area.

The amplitude area (0 to 128) is preferably divided (step 112) into 41 examination periods, as shown in FIG. 12. The amplitude deviation, i.e. length of the period, is preferably ±3. The periods are examined 113 one by one and only the impulses, whose amplitude is within the period, are examined at each time. The amplitude area is divided into smaller examination periods so as to be able to examine the time difference between pulses of certain amplitudes. By changing the amplitude deviation and the number of examination periods, it is possible to change the maximum allowed amplitude deviation of asynchronous impulse interference. When the examination periods overlap somewhat, all asynchronous interferences can be detected regardless of their amplitude and amplitude deviation.

By means of the information on the starting phase angle of the pulse and the cycle number, it is possible to calculate the time difference of equal-amplitude pulses to the pulses preceding them (for instance, the pulse peaks in FIG. 15 are set in place using the information on phase angle and cycle number). The information is stored 114 in the time difference matrix. FIG. 13 shows the basic structure of the matrix. Each vertical line shows the time difference of the pulses in question to the pulses preceding them, for instance line 5, column 8 shows the time difference of the fifth and eighth pulse. The time difference matrix contains the time difference (i.e. distance) of each pulse to all pulses preceding it within the same examination period.

Figure 16:
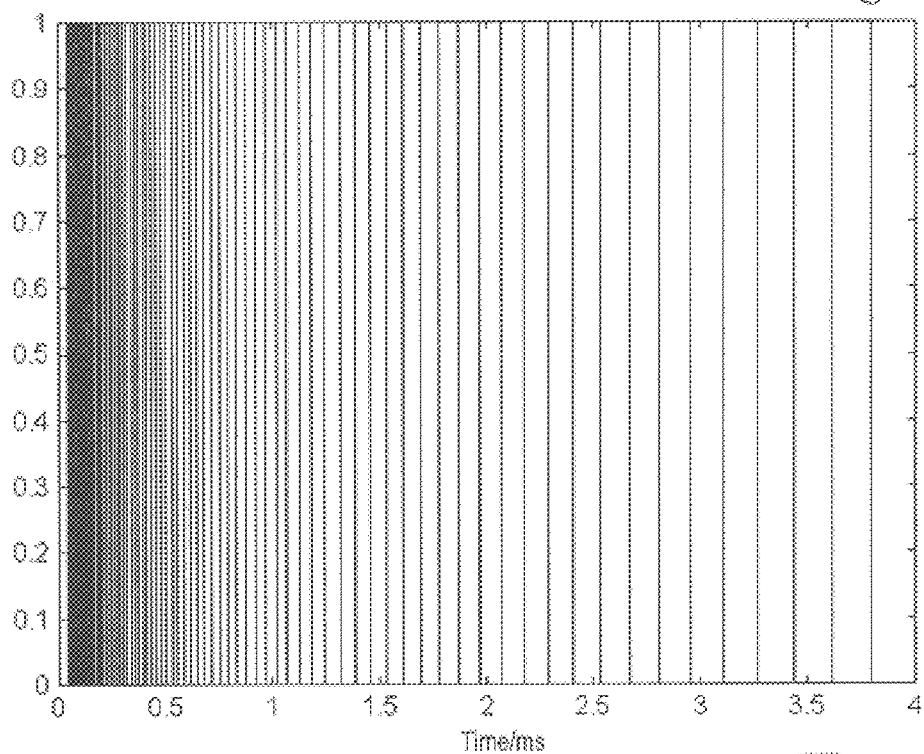
FIG. 16 shows the distribution of the blocks of the time difference distribution.

Simultaneously with making the time difference matrix, a time difference distribution is created 114. The distribution is formed in the range of 0.04 to 4 ms, for instance. The distribution is preferably divided into 91 logarithmic blocks so that the step from one block to another is 5.2%. At the location of the time difference in question, the value time difference/20 is added to the distribution and, on both sides of the time difference, the value (time difference/20)2. FIG. 16 shows the division of the blocks of the time difference distribution. The size of the blocks increases from left to right. The distribution is formed of the time difference between consecutive pulses in the same examination period (i.e. the time difference of the pulse to the pulse preceding it). In practice, the values from which the distribution is formed are immediately above the diagonal axis of the time difference matrix.

Figure 17:
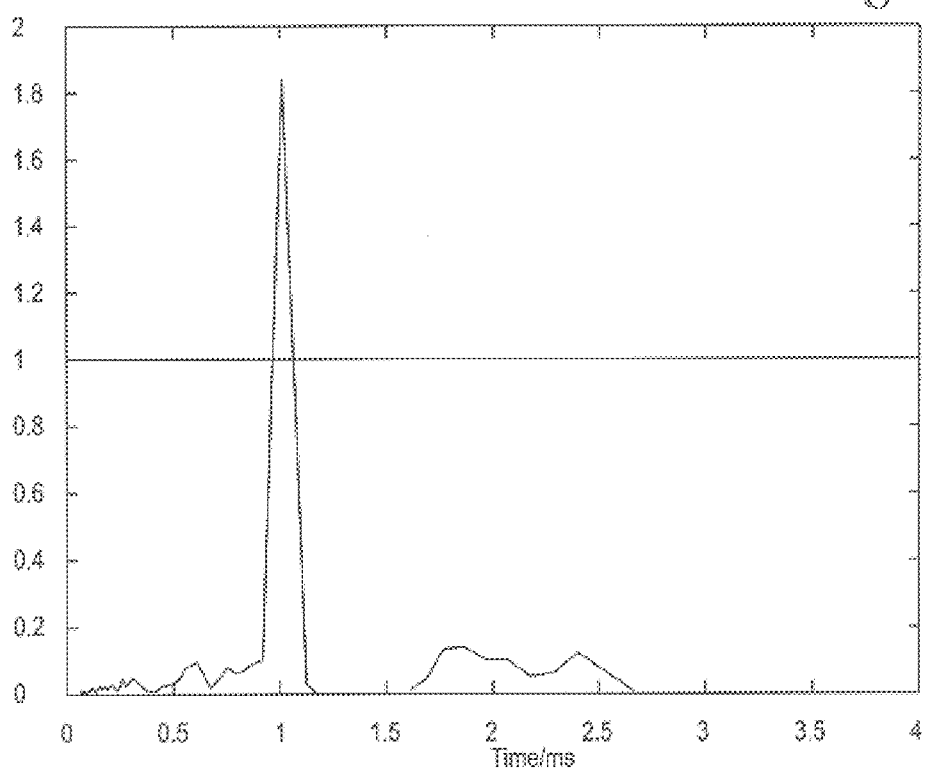
FIG. 17 shows a time difference distribution formed for the exemplary signal.

FIG. 17 shows a time difference distribution formed for the exemplary partial discharge signal mentioned earlier in an examination period of 21±3. The distribution shows a strong peak at approximately 1 ms and the peak is higher than the value 1 set as the threshold, and consequently on the basis of the distribution, it can be noted that the signal has asynchronous impulse interference at 1 ms (16,000 samples) intervals.

The value time difference/20 is a density index. The sum of indexes which is finally obtained from the distribution, depicts the seriousness of the situation in a way. As the description will later show, so as to have the pulses occurring at 0.2 ms intervals occur "as often" as the pulses occurring at 1 ms intervals, there must be five times as many pulses occurring at 0.2 ms intervals. The height of the peak in the distribution shown in FIG. 17 is approximately 1.8. The peak value for three cycles is 3, so the peak shows that over a half of the pulse pairs occurring at 1 ms intervals have been detected. The time difference of consecutive pulses only is stored in the distribution.

The fact that the values (time difference/20)2 are added in the distribution to neighbouring locations of the found time difference, endeavours to round the distribution and to ensure that also the time differences that are at the border of two blocks will be detected.

The value time difference/20 means that the value 1 will be obtained for the distribution, if the cycle has 20 pulses at 1 ms intervals or 100 pulses at 0.2 ms intervals. The distribution thus shows the time difference at which interval equidistant pulses occur proportionally the most.

When the time difference information has been calculated for each equal-amplitude pulse, the maximum of the time difference distribution is found 115 and the time difference with which it is realised. If the peak value of the time difference distribution is higher than a pre-set threshold value, pulses repeating at equal intervals in the time difference matrix are searched for. A three-cycle long measurement uses the value 1 as the threshold value. This requires that when forming the time difference distribution, at least every third of the repeating pulse pairs have been detected. The threshold value should not be set too high, because it may happen that there are both partial discharge pulses and interfering pulses in the same examination period. It is not always possible to obtain the time difference between two interfering pulses at partial discharge groups, but it is probable that a time difference between a partial discharge pulse and an interfering pulse is obtained. The threshold value is, however, so high that partial discharge do not exceed it. Not even the pulse strings of a corona discharge are "long" enough to be interpreted as interference. The value time difference/20 scales the distribution so that the highest possible value of the distribution corresponds to the number of cycles. If there were samples from one network cycle only, the peak value would be 1. In the example, three network cycle long packets are examined, and the peak value of the distribution is 3.

Figure 18:
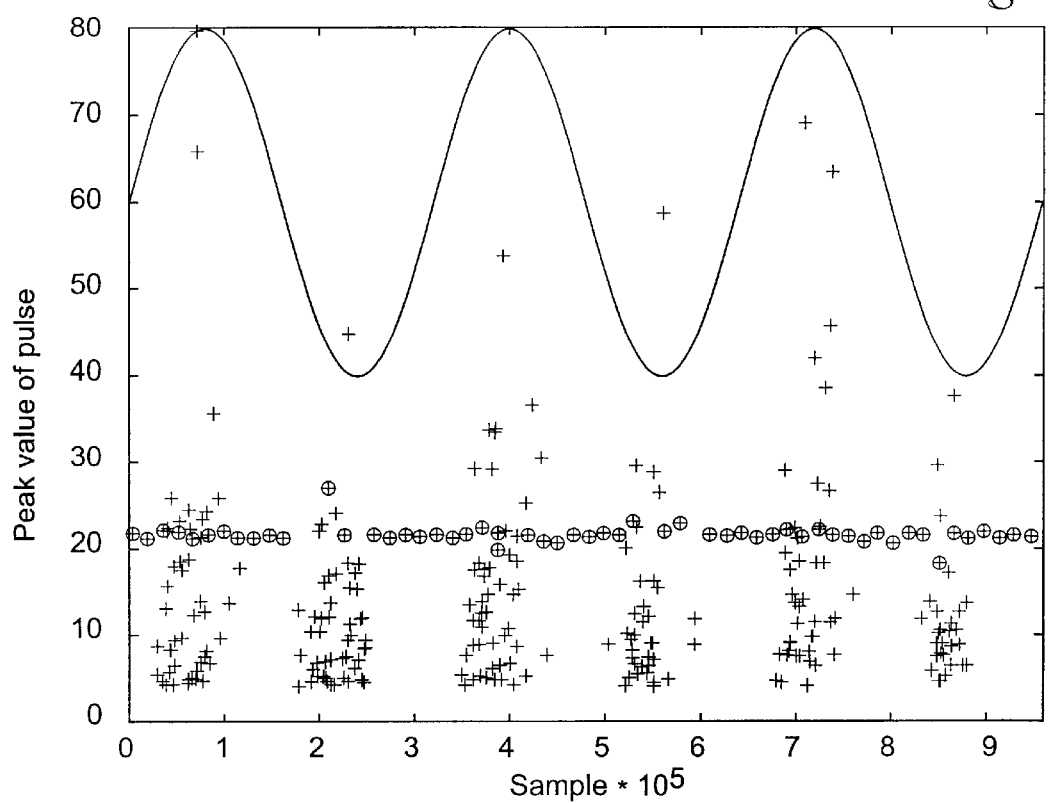
FIG. 18 shows the interfering pulses detected in the exemplary signal.

Finding 116 pulses that repeat at equal intervals in the time difference matrix is done as follows. The search is started using pulse 1 as the first pulse. From the first horizontal line a value is searched which is within the range:

$$k.AE-0.135.AE \leq Value \leq k.AE+0.135.AE$$

wherein AE is the time difference between repeating pulses, obtained from the time difference distribution and k is 1, 2, 3 . . . FIG. 20 shows the values of a time difference matrix for the first 31 pulses. The time difference between repeating pulses is 1 ms in the example. In this case, the value meeting the conditions is found on line 1, location 22 of the matrix. The pulse index is stored so that it can be marked as an interfering pulse, if the found pulse string meets the conditions set for it. The pulse search is now continued from line 22. A value meeting the conditions cannot be found in this table and it can be noted later that several pulses are missing from the found pulse string, i.e. it is not uniform enough to be an interfering pulse string. The search is then started from the beginning using pulse 2 as the first pulse. A value meeting the conditions is searched for on the $2^{nd}$ vertical line. It is found at location 3. The pulse index is stored and the search is continued on line 3. A suitable value is found at location 5, the index is stored and the search is continued on line 5. A value which is within the desired range when k=1 is searched for on line 5. Such a value is found at location 7 and the search is continued on line 7. If the pulse at location 7 had not been found and the location in question had had the value 1.2 for instance, it would be noted here that when k=1, there is no value meeting the conditions on this line, since the values increase from left to right on the lines. The value of k would then be increased by one and the search continued from this location onward. A value meeting this condition would be found in location 10 and the search continued on line 10. Always when starting to search for the next interfering pulse, the value of k is set to 1. If an interfering pulse cannot be found, the value of k is increased by one. When the time difference of interfering pulses obtained from the distribution is 1 ms, for instance, a pulse string is searched for from the time difference matrix, whose time difference between pulses is k×1 ms ±0.135 ms. The interfering pulses found in the exemplary signal are circled in FIG. 18.

When the entire pulses set has been examined, a check is made to see whether the pulse string is sufficiently uniform. The condition is preferably that at least half of the pulses have been found. If the pulse string is sufficiently uniform, the pulses in it are marked 117 as interfering pulses. The number of found interfering pulses can easily be calculated and the maximum number of interfering pulses occurring at intervals of certain time differences can also be calculated by means of the time difference and the sampling time by dividing the sampling time by the time difference between the pulses. In other words, in the three-cycle long measurement and the 1-ms time difference used in the example, this is (3×20 ms)/1 ms=60 pulses. Thus, if in this case, more than 30 interfering pulses are found, the pules string is sufficiently uniform.

Figure 19:
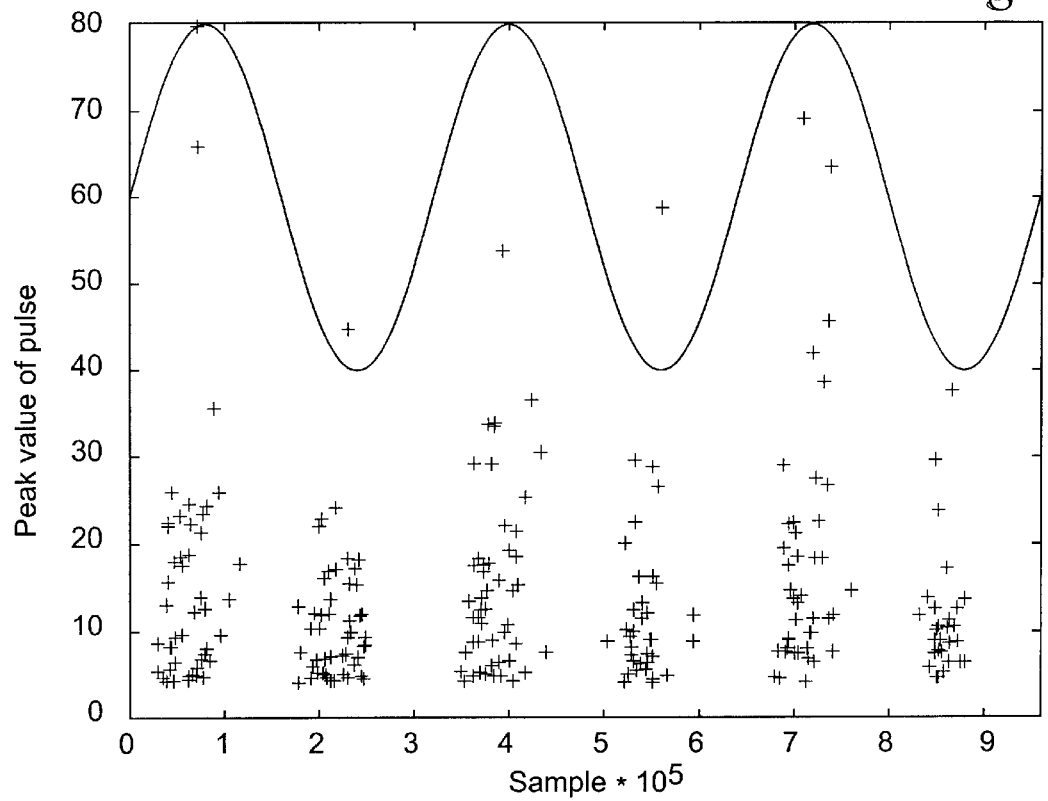
FIG. 19 shows an exemplary signal from which interfering pulses have been eliminated.

When all examination periods have been examined 118, all pulses occurring within the amplitude area are checked and the pulse parameters of the pulses that have been marked as interfering pulses are removed 119 from the database. FIG. 19 shows an exemplary signal from which all detected interfering pulses have been removed. The following parameters, for instance, can be changed in the method: amplitude deviation, number of examination periods, time difference deviation and number of searched asynchronous interfering pulses. Further, the time difference matrix can be replaced by calculating only the values immediately above its diagonal, i.e. by defining the time difference of consecutive pulses. The time difference between two pulses can be calculated using these values, but the calculation becomes more complicated.

Eliminating Synchronous Impulse Interference 200

The operation of a method of eliminating synchronous impulse interference is based on the fact that the typical properties of a partial discharge pulse and synchronous interfering pulses differ from each other enough to make distinguishing them possible. Partial discharge pulses occur in pulse groups in areas of cycle depending on the discharge type, but there is deviation in the location and amplitude of a single pulse, whereas synchronous impulse interference occurs at nearly the same phase angle and at nearly constant amplitude.

Figure 21:
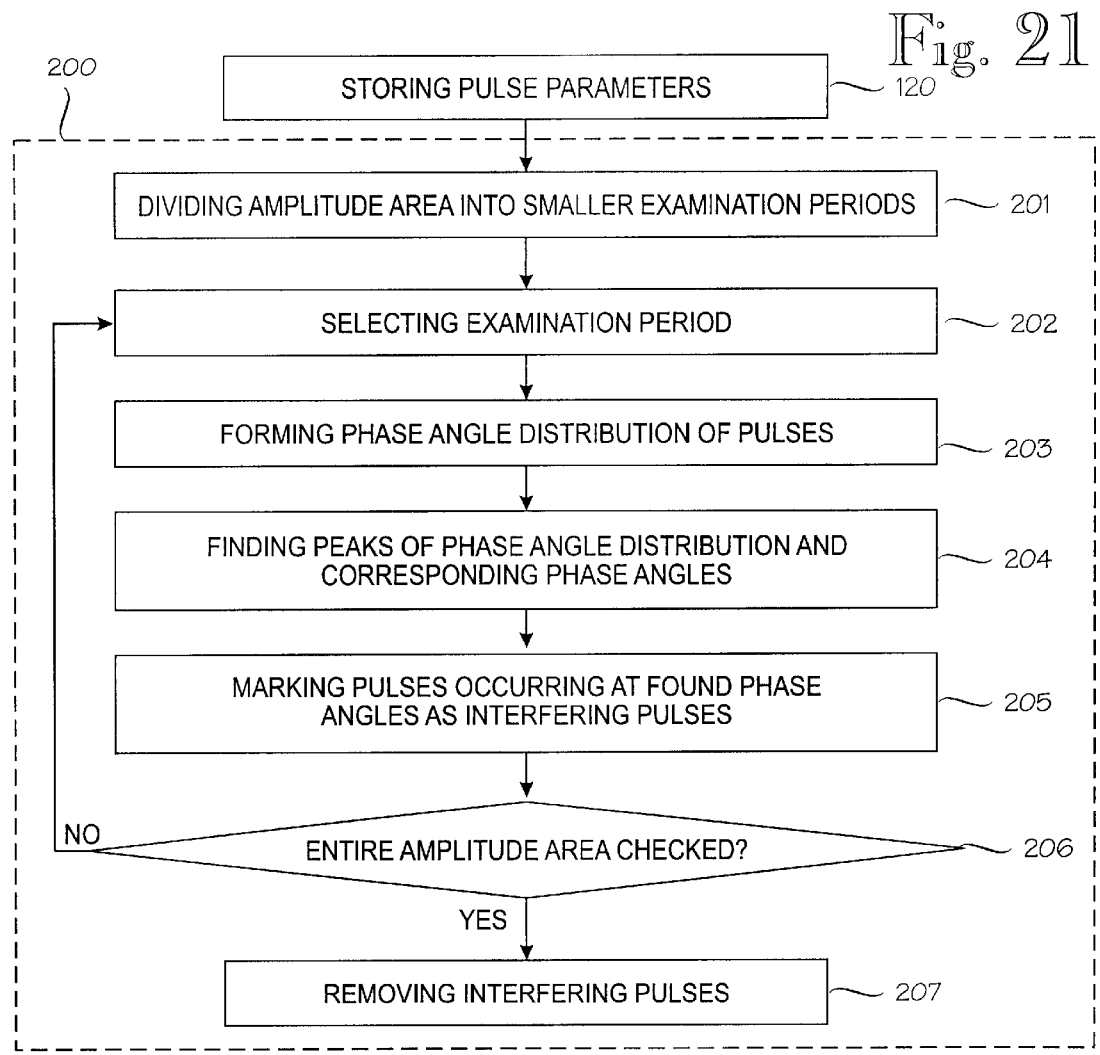
FIG. 21 shows a block diagram of a method of eliminating synchronous impulse interference.

As starting data, the method preferably uses pulse parameters obtained by finding the pulses occurring in a partial discharge measuring signal and calculating and storing 120 their pulse amplitude, starting phase angle and cycle number. In the earlier phases, the amplitude of the pulses was scaled to between 0 and 128. The number of synchronous interfering pulses during one cycle is assumed to vary case by case. The flow chart of the method is shown in FIG. 21.

The amplitude area (0 to 128) is divided (step 201) into smaller examination periods like in connection with asynchronous impulse interference elimination. The amplitude area is, for instance, divided into 20 partly overlapping examination periods and the width of a period is ±0.055x the amplitude of the largest pulse in the pulse series. The examination periods are examined 202 one at a time and only the pulses are examined, whose amplitude is within the period.

First a phase angle distribution of the pulses is formed 203 by checking all pulses in the same examination period and forming the distribution from their starting phase angles. The distribution is divided into 180 blocks, for instance, in relation to the phase, i.e. the width of one block corresponds to 2°. When forming the distribution, one should also take into consideration the other pulses occurring in the same cycle. Forming the distribution is started from the first measured cycle and the first block of the distribution, i.e. phase angles 0 to 2°. The value 1 is added to the first block of the distribution, if in the first cycle, only one pulse occurs in said block and no pulses occur within two blocks of the examined block, i.e. phase angles 2 to 6°. If the fifth block, for instance, were examined, i.e. phase angles 8 to 10°, there should be no pulses at the phase angles 4 to 8° and 10 to 14°. If there are more than one pulse in the block or if there are pulses in the neighbouring blocks, the value of the distribution is not changed. This action endeavours to prevent the elimination of partial discharge pulses. Even though partial discharge pulses are quite irregular, it is possible that, in the middle of pulse groups, pulses occur so densely that some of them may be identified as synchronous impulse interference. The drawback in this is that synchronous interfering pulses occurring at the same phase angles as partial discharges cannot necessarily be identified. The obtained distribution is rounded by summing the values of the neighbouring blocks to each block.

Before finding the peaks 204, the phase angle distribution is normed by dividing its values by the number of cycles. Any values higher than 0.4 are interpreted 204 as peaks of the phase angle distribution. If peaks are detected, the pulses are re-examined and the pulses occurring at phase angles corresponding to the peaks are marked 205 as interfering pulses. The marking as interfering pulses is, however, done so that only one pulse per cycle is marked as an interfering pulse in one phase window. Thus, it one phase window has both a partial discharge and an interfering pulse, at least one of them will be analysed.

When all examination periods have been examined 206, all pulses within the amplitude area are checked and the pulse parameters of the pulses that are marked as interfering pulses are removed 207 from the database. In the method, the following parameters, for instance, can be changed:

amplitude deviation, number of examination periods and threshold value of peak search.

Analysing Partial Discharges 300

Measurements are made until there is at least a certain number 122 of collected pulses which herein is called the analysis limit. The analysis limit is a thousand pulses, for instance. A collected group of for instance a thousand pulses is in the following called a sample, that is a pulse group.

One or more of the following graphs are preferably formed 301 of each pulse group:

maximum peak value of partial discharge pulses in each phase window (the phase angle axis is divided into 256 phase windows, for instance, to which the measured pulses are distributed on the basis of their starting phase angles. The width of one phase window is then 1.4°).

average peak value of partial discharge pulses in each phase window, number of partial discharge pulses in each phase window, histogram formed of starting voltage differences of consecutive pulses (the histogram shows the number of pulse pairs formed by consecutive pulses in each starting voltage difference window), distribution of time differences of pulses to the next pulse having nearly the same apparent charge, histogram formed of starting voltage differences of consecutive positive half-cycle pulses (the histogram shows the number of pulse pairs formed by consecutive positive pulses in each starting voltage difference window), and histogram formed of starting voltage differences of consecutive negative half-cycle pulses (the histogram shows the number of pulse pairs formed by consecutive negative pulses in each starting voltage difference window).

A number of characteristic parameters containing the most essential information on the graphs are calculated 302 from each graph. Examples of the graphs and characteristic parameters are described later in this description. The calculated characteristic parameters are compared 304 with information obtained from a reference library 600 and as a result of the comparison, a conclusion is reached 305 on the cause of the partial discharge in the cable.

Figure 24:
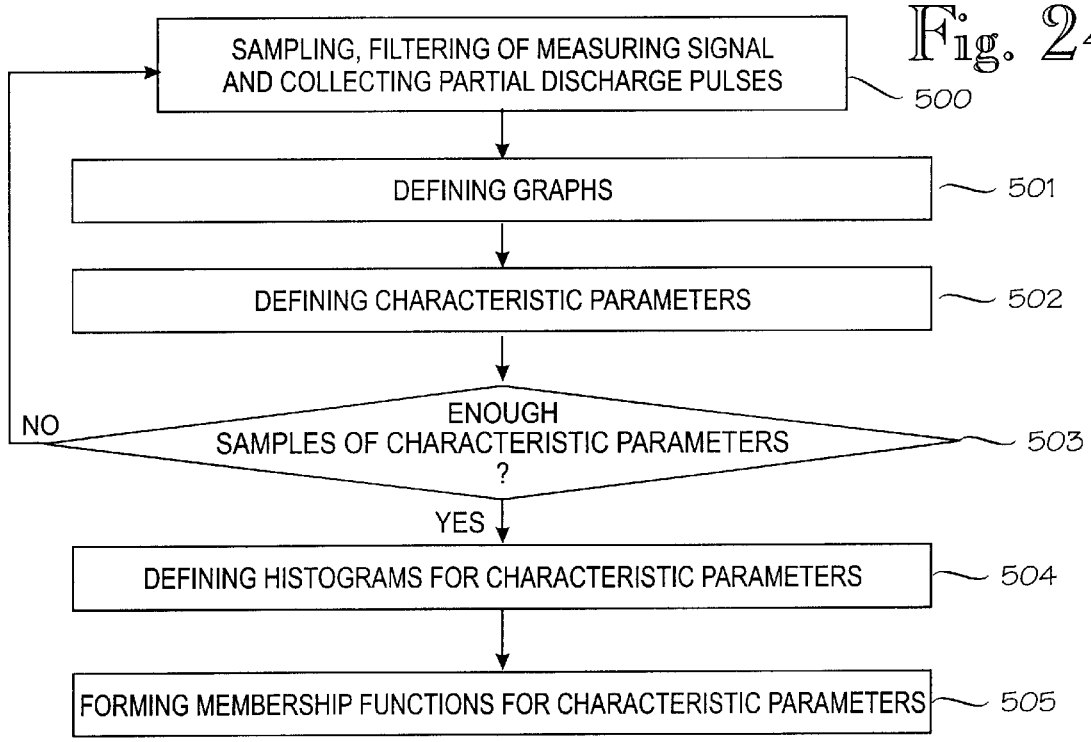
FIG. 24 shows a flow chart of forming a reference library.

The reference library 600 comprises typical values and their range of variation of partial discharge characteristic parameters related to most common partial discharge causes occurring in a measurement object. A flow chart on forming the reference library 600 is shown in FIG. 24. The library contains a description of 18 different partial causes, for instance. Examples of the partial discharge causes are described later in this description. Each partial discharge cause is depicted by 45 characteristic parameters, for instance. For the reference library 600, tens of samples of each depicted partial discharge cause have been measured 500 in various conditions to find out the range of variation of the measuring signal. A measurement 500 for the reference library 600 can be performed in substantially the same manner as the measurement 400 performed to find out the cause of the partial discharge and described earlier. First the necessary graphs are defined 501 from each sample and said 45 characteristic parameters, for instance, are calculated 502 from them. When enough values are obtained 503 for the characteristic parameters, a histogram is formed 504 for each characteristic parameter on the basis of the values obtained from different samples of the characteristic parameter in question. The range of variation of the characteristic parameter is depicted 505 using a fuzzy logic membership function which is formed, for instance, by matching a sixth degree polynome function to the above-mentioned histogram. Fuzzy logic is a kind of an extension for the conventional true-false logic which as interpreted in the set theory defines whether the element belongs to the set (or not). A basic concept of fuzzy logic is a truth value which may vary between 0 and 1 (false-true). The truth value is usually defined for a certain event as a function of the variables (elements of the set) of the real axis (set of all real numbers), which is called a membership function. One partial discharge cause is thus depicted in the reference library 600 by 45 membership functions, for instance. The membership functions may be of different basic types, such as a delta or a sixth degree polynome function.

When analysing a measuring signal, 45 characteristic parameters, for instance, are calculated from the measured sample. Comparing 304 the measurement data with the data in the reference library is preferably done as follows: the values of the characteristic parameters are placed in the membership functions of the partial discharge cause described first in the reference library, whereby the values of the membership functions in the points in question are obtained. According to a preferred embodiment of the invention, the values are multiplied by parameter-specific weighting coefficients and summed. This produces an index number which depicts the similarity of the sample and the partial discharge cause described in the reference library. The index number varies between 0 and 100. This is repeated with all partial discharge causes described in the reference library 600, whereby a list of index numbers is obtained, the numbers showing how well the measured sample corresponds to each partial discharge cause described in the reference library 600. The result is shown 305 in a bar chart or list containing the index numbers (e.g. 18 numbers) of all partial discharge causes. If the highest index number exceeds a threshold value, called herein the identifiability limit, this index number and the corresponding partial discharge cause is preferably reported 305. In addition, it is possible to report 305 as alternative diagnoses, for example, two partial discharge causes whose index numbers are the next highest, if their index numbers exceed the identifiability limit. Also, it is possible to show 305 in a bar chart or list the index numbers of the four main discharge types (spark, corona, surface and cavity discharge), for instance, which have been calculated as an average of partial discharge cause index numbers in each main discharge type. If none of the index numbers of partial discharge causes exceed the identifiability limit, it can be reported 305, for instance, that there is an unknown defect in the cable. It is obvious that the results of the comparison 304 can also be presented and used in other manners than as described above without departing from the basic idea of the invention.

The parameter-specific weighting coefficients mentioned earlier in this description depict the ability of a single characteristic parameter to distinguish the partial discharge causes of the reference library 600 from each other. The weighting coefficient of a characteristic parameter is, for instance, preferably defined as follows: first, an average and standard deviation of the characteristic parameter is calculated from all samples of the partial discharge cause for each partial discharge cause (e.g. 18). This thus results in 18 averages and standard deviations, for instance. Next, deltoid membership functions, for instance, are formed for each partial discharge cause, in which the peak of the delta is at the average and the foot points are located ±2 times the standard deviation from the average. The area between the foot points of the delta is in the following called the range of variation. Next, one of the partial discharge causes is selected as a comparison object and the average of the other partial discharge causes (which are in the following called the examined partial discharge causes) is compared with the range of variation of the comparison object. If the average of the examined partial discharge causes is within the range of variation of the comparison object, the result of the comparison, i.e. the comparison value, is 1. If the average is not within the range of variation, the limit of the range of variation of the examined partial discharge cause which is closest to the average of the comparison object is selected and placed in the membership function of the comparison object. The comparison result (comparison value) is thus the value of the membership function of the comparison object at the above-mentioned point. The comparison described above is repeated for every partial discharge cause (e.g. 18) by using as the comparison object each partial discharge cause at a time. Finally, the average of all comparison values of the characteristic parameter is calculated, the average varying between 0 and 1.

The above-mentioned calculation process is repeated until a comparison value average has been calculated for all (e.g. 45) characteristic parameters. The weighting coefficients of the characteristic parameters are obtained by taking the inverse of the comparison value averages and multiplying the obtained numbers by a constant term so that the sum of the numbers becomes 100.

Thus, the values of the weighting coefficients are determined on the basis of the measurement data used in forming the reference library 600. If changes are made to the reference library 600, the weighting coefficients of the characteristic parameters should also be updated to obtain the best possible identification accuracy.

An alarm limit is preferably set for each defect type in the reference library 600. For instance, if the discharge strength index depicting the strength of the discharges exceeds the alarm limit of a defect type, an alarm can be given or other action taken.

Graphs and characteristic parameters used in identifying the cause of a partial discharge Phase angle and/or pulse sequence analysis can, for instance, be used as identification methods. Each analysis method contains one to four graphs, for instance, and 1 to 12 characteristic parameters, for instance, are calculated from each of the graphs.

In this context, a phase angle analysis refers to an analysing method of partial discharge pulses, which examines the behaviour of partial discharge pulses and pulse series in relation to a network-frequency phase voltage (e.g. 50 or 60 Hz). Measurement data is collected during several (even hundreds or thousands) network cycles so as to be able to make statistical analyses on the behaviour of partial discharge pulses. In the analysis, attention is attached to the shape of the distribution envelopes formed of the pulse series collected during several cycles. The analysis does not examine the interaction between individual pulses. In the phase angle analysis, three graph types: $\phi\text{-}q_{max}$, $\phi\text{-}q_{avg}$, $\phi\text{-}n$ are preferably used. From the first, 12 characteristic parameters are preferably calculated and from the two latter ones, 9 characteristic parameters each. In one phase angle graph, the discharge pulses of tens or hundreds of network cycles are usually superposed on one (e.g. 50 or 60 Hz) network cycle.

Figure 25:
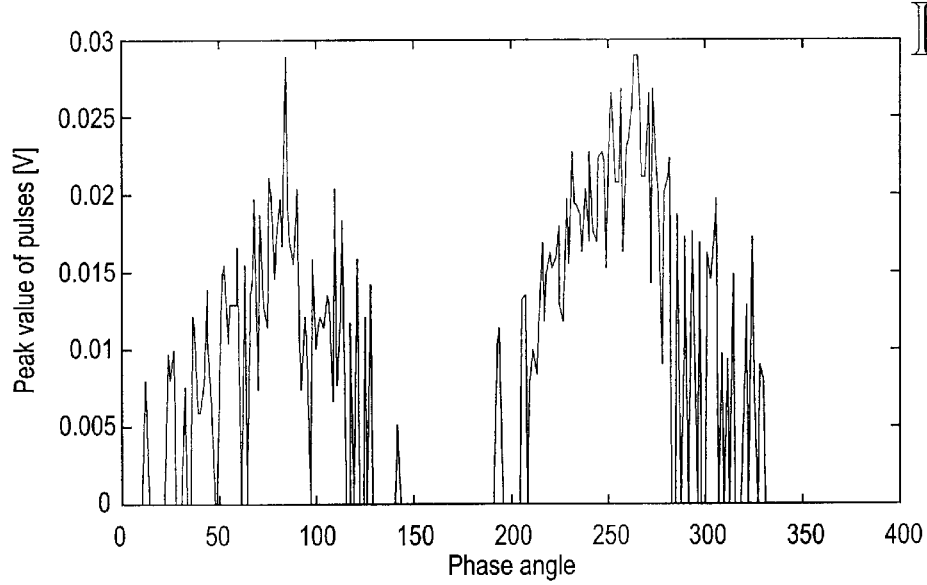
FIG. 25 shows an example of a graph $\phi$-$q_{max}$.

The maximum amplitude of discharge pulses which occurred during several network cycles in each phase window are collected in the graph $\phi\text{-}q_{max}$. An example of the graph $\phi\text{-}q_{max}$ is shown in FIG. 25.

The characteristic parameter Q (intensity asymmetry) shows the difference between the strengths or number of negative and positive half-cycle pulses. The difference is typically biggest, if the measured discharge has occurred in a very asymmetrical electrode structure (e.g. a corona discharge in a sharp point). Q is obtained by defining a quotient of the averages calculated from the strengths or number of the negative and positive half-cycle pulses.

The characteristic parameter Phi (phase asymmetry) shows the difference in the starting phase angles of the negative and positive half-cycle pulse series (i.e. simultaneously in the starting voltages of the discharges). Phi is the quotient of the starting phase angles of the negative and positive half-cycle pulse series.

The characteristic parameter Phi+ is the starting phase angle of a positive half-cycle pulse series. Corona discharges, for instance, mainly occur close to the peak points of the phase voltage, whereas cavity discharges, for instance, concentrate on the 1st and 3rd quadrants of the phase voltage (phase angles 0 to 90° and 180 to 270°). Spark discharges occur mainly close to the zero points of the phase voltage.

The characteristic parameter Phi– is the starting phase angle of a negative half-cycle pulse series.

The characteristic parameter cc (cross correlation) shows the difference in the shape of the positive and negative half-cycle discharge pulse series. The numerical value of the cross correlation may vary between 0 and 1.

The characteristic parameter mcc (modified cross correlation) is the product of the characteristic parameters Q, Phi and cc.

The characteristic parameters Sk+ and Sk– show the skew of the envelopes of the positive and negative half-cycle pulse series in comparison with the normal distribution. Sk is negative if the peak of the envelope is on the right in comparison with the peak of the normal distribution, and positive if the peak is on the left in comparison with the peak of the normal distribution.

The characteristic parameters Ku+ and Ku– show the flat-topness of the envelopes of the positive and negative half-cycle pulse series. Ku is negative if the top of the envelope is flatter than the normal distribution and positive if the top of the envelope is more pointy than in the normal distribution.

The characteristic parameters Pe+ and Pe– show the number of local peaks of filtered envelopes of positive and negative half-cycle pulse series. The filtering is performed by a digital FIR (finite impulse response) low-pass filter whose barrier frequency is suitably selected. In practice, the value of the Pe characteristic parameters varies between 1 to 10.

Figure 26:
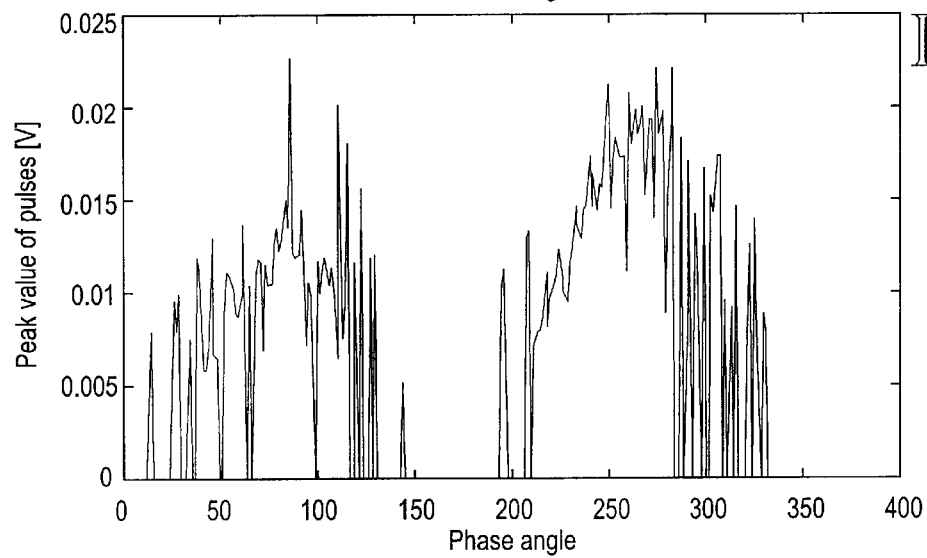
FIG. 26 shows an example of a graph $\phi$-$q_{avg}$.

The average amplitude of discharge pulses which occurred during several network cycles in each phase window are collected in the graph $\phi\text{-}q_{avg}$. An example of the graph $\phi\text{-}q_{avg}$ is shown in FIG. 26.

The characteristic parameters show the same $\phi\text{-}q_{avg}$ graph properties as the corresponding characteristic parameters in the case of the $\phi\text{-}q_{max}$. The Phi characteristic parameters are not calculated separately from the $\phi\text{-}q_{avg}$ graph, because the result would be the same as in the case of the $\phi\text{-}q_{max}$ graph.

Figure 27:
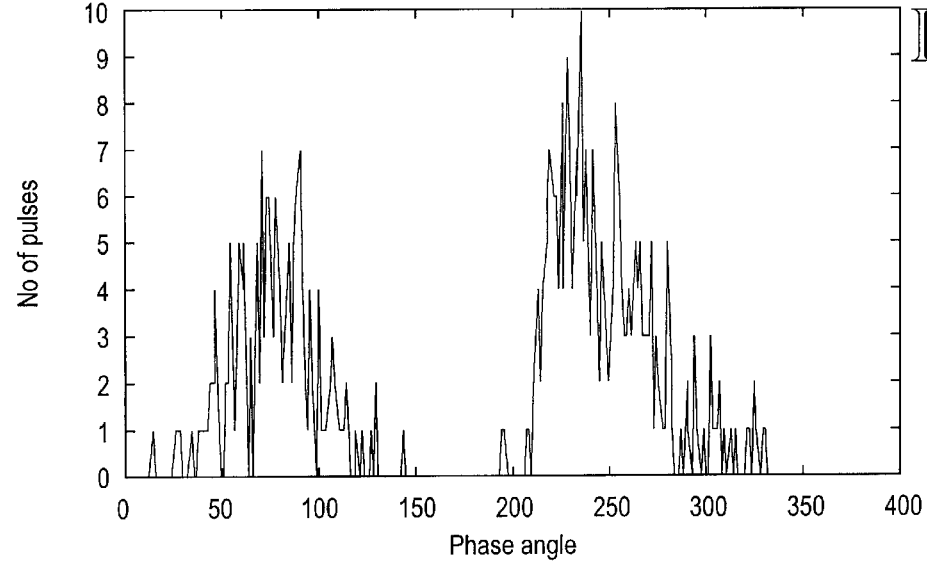
FIG. 27 shows an example of a graph $\phi$-n.

The graph $\phi\text{-}n$ contains the total number of discharge pulses which occurred during several network cycles in each phase window. An example of the graph $\phi\text{-}n$ is shown in FIG. 27.

The characteristic parameters show the same $\phi\text{-}n$ graph properties as the corresponding characteristic parameters in the case of the φ-$q_{max}$. The Phi characteristic parameters are not calculated separately from the φ-n graph, because the result would be the same as in the case of the φ-$q_{max}$ graph.

A pulse sequence analysis refers herein to an analysis method in which correlation between consecutive pulses (e.g. starting voltages or starting voltage differences of consecutive pulses) are examined, the correlation providing information on local residual charges in the discharge location, for instance, and their effect on the starting voltage of the next pulse. A pulse sequence analysis offers better opportunities to analysing a discharge signal based on the physical phenomena of the discharge location. A pulse sequence analysis uses four graph types, for instance: n($\Delta u_i$), dt-q, n($\Delta u_{i(pos)}$) and n($\Delta u_{i(neg)}$). The essential characteristics of each graph are described with 1 to 6 characteristic parameters, for instance.

Figure 29:
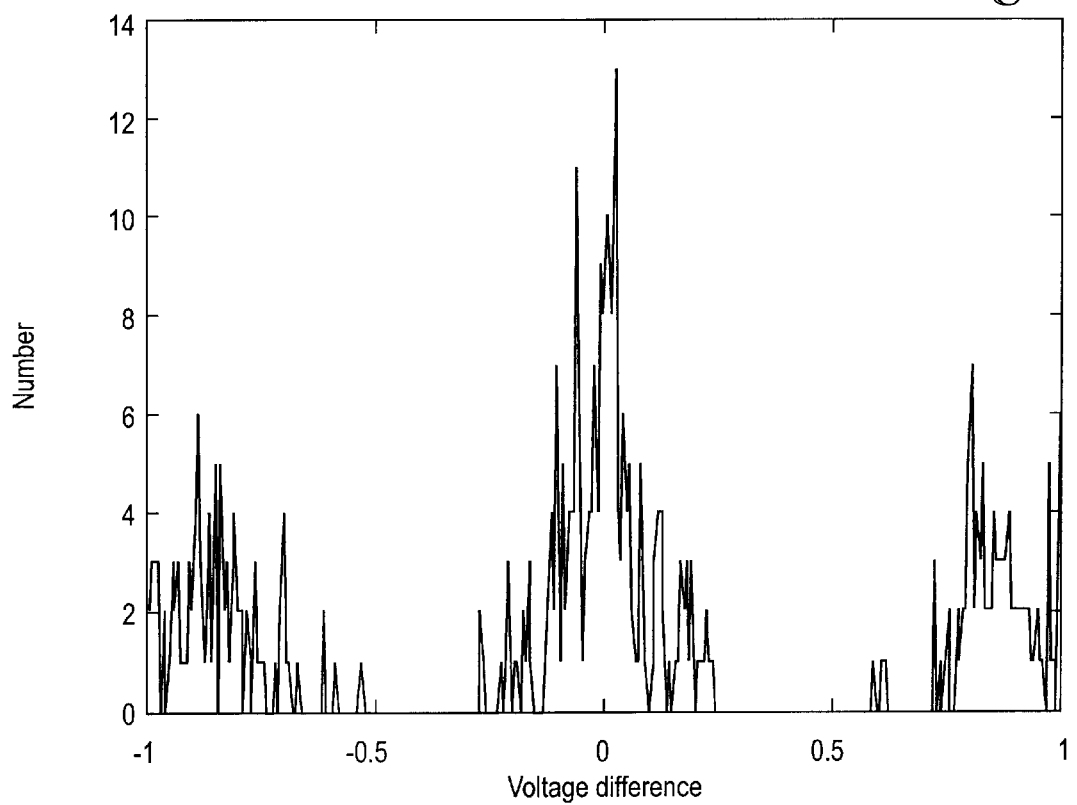
FIG. 29 shows an example of a graph n($\Delta u_i$)

The graph n($\Delta u_i$) is formed by calculating the differences in starting voltages of consecutive pulses (the starting voltage of the preceding pulse is subtracted from the starting voltage of the pulse) during the entire measurement period and making them into a histogram. The histogram usually has 1 to 4 peaks, but there may be more peaks. One example of the graph n($\Delta u_i$) is shown in FIG. 29.

Characteristic parameter calculations are made from the filtered envelope of the histogram. The filtering is done by a digital FIR low-pass filter whose barrier frequency is suitably selected.

The characteristic parameter Pe (number of peaks) shows the number of local peaks in the histogram.

The characteristic parameter Do (distance between furthest peaks) shows the distance between the furthest local peaks in the histogram.

The characteristic parameter D0avg (average distance of peaks from zero) shows the average distance of the local peaks in the histogram from the zero point of the histogram.

The characteristic parameter Wavg (average width of peaks) shows the average width of the local peaks in the histogram. The width of the peaks is preferably defined at 50% height.

The characteristic parameter Wdist (standard deviation of peak width) shows the standard deviation of the width of the local peaks in the histogram.

The starting voltages of pulses are preferably defined calculatorily on the basis of the phase angle by presuming that the peak value of the network phase voltage is the nominal voltage of the network.

Figure 28:
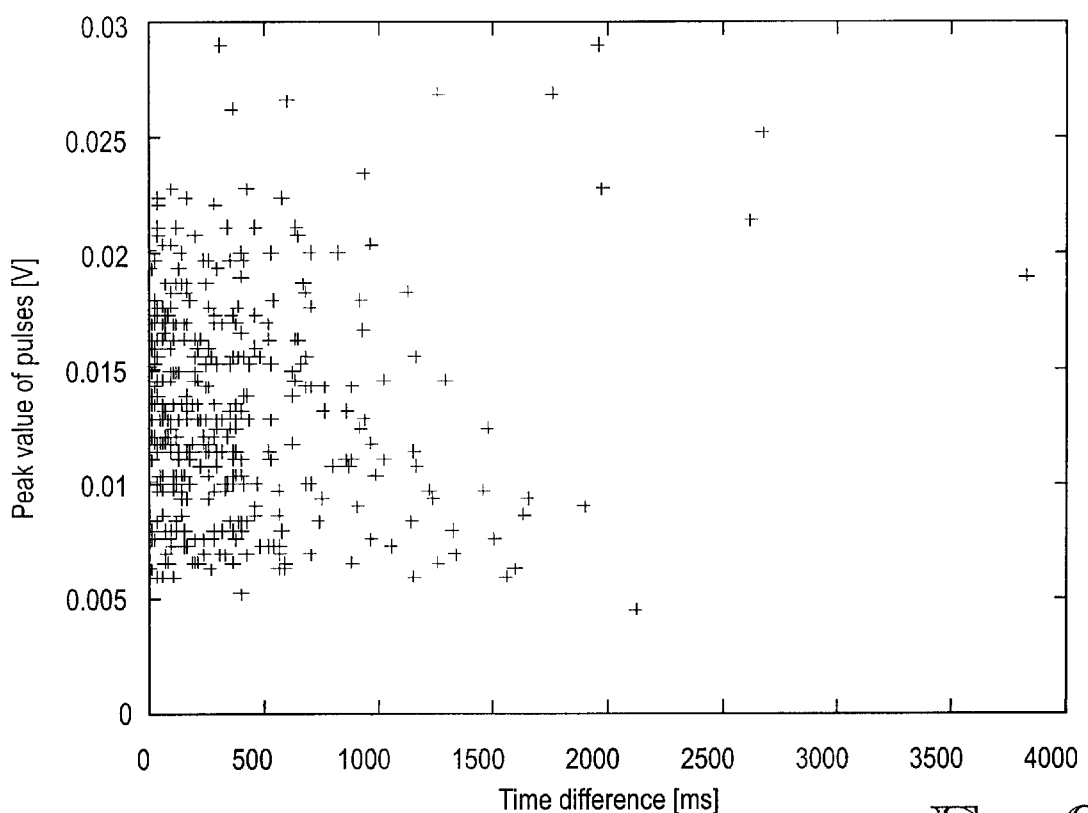
FIG. 28 shows an example of a graph dt-q.

The graph dt-q is a matrix which contains the time differences of pulses to a preceding pulse of approximately equal size in apparent charge (=in the same apparent charge window). For each pulse pair, one matrix element is increased by one. Different defect types map in different locations in the matrix as areas of different sizes. An example of the graph dt-q is shown in FIG. 28.

The characteristic parameter Xmin ($x_{min}$ coordinate) shows the smallest time difference of same-sized pulses, which occurs commonly in measurement. The value of the characteristic parameter is defined by fetching from zero onward the first matrix column in which at least one element exceeds the set threshold value. The threshold value can be 3, for instance.

The characteristic parameter Xmax ($x_{max}$ coordinate) shows the biggest time difference of same-sized pulses, which occurs commonly in measurement. The value of the characteristic parameter is defined by fetching from the right side of the matrix onward the first matrix column in which at least one element exceeds the set threshold value (e.g. 3).

The characteristic parameter Ymin ($y_{min}$ coordinate) shows the lowest peak value of a pulse, which occurs commonly in measurement. The value of the characteristic parameter is defined by fetching from the lower edge of the matrix onward the first matrix line in which at least one element exceeds the set threshold value (e.g. 3).

The characteristic parameter Ymax ($y_{max}$ coordinate) shows the highest peak value of a pulse, which occurs commonly in measurement. The value of the characteristic parameter is defined by fetching from the top edge of the matrix onward the first matrix line in which at least one element exceeds the set threshold value (e.g. 3).

The characteristic parameter Gx (centre of gravity, x coordinate) is the x coordinate of the centre of gravity calculated from the distribution of time differences of same-sized pulses.

The characteristic parameter Gy (centre of gravity, y coordinate) is the y coordinate of the centre of gravity calculated from the distribution of time differences of same-sized pulses.

Figure 30:
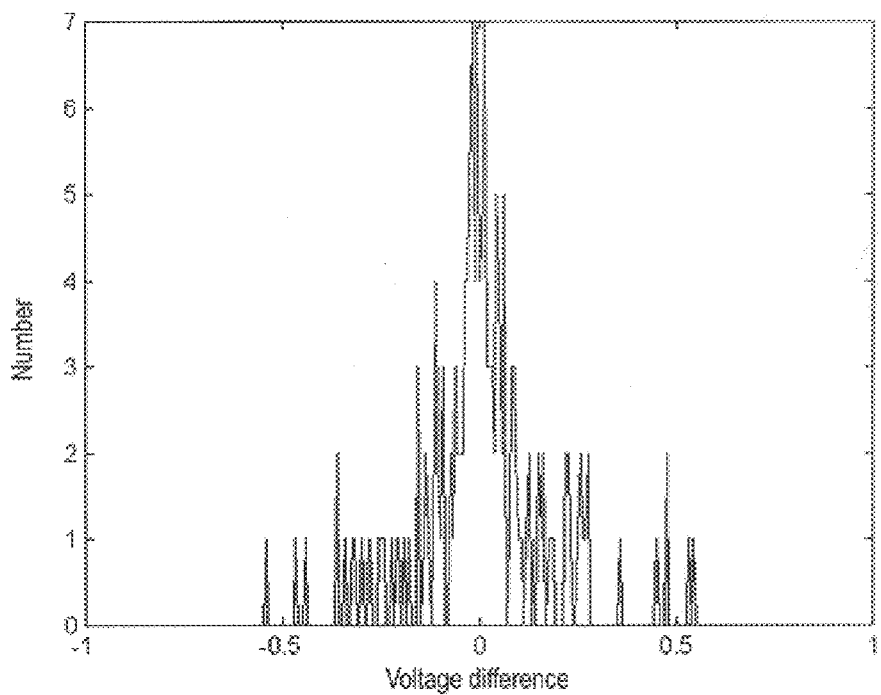
FIG. 30 shows an example of a graph n($\Delta u_{i(pos)}$)

The graph n($\Delta u_{i(pos)}$) is formed by calculating the differences in starting voltages of consecutive positive pulses (the starting voltage of the preceding positive pulse is subtracted from the starting voltage of the positive pulse) during the entire measurement period and making them into a histogram. An example of the graph n($\Delta u_{i(pos)}$) is shown in FIG. 30.

The characteristic parameter calculations are preferably made from the filtered envelope of the histogram. The filtering is done by a digital FIR low-pass filter whose barrier frequency is suitably selected.

The characteristic parameter Lpe (location of peak) shows the location of the (highest) local peak in the histogram on a voltage axis.

The characteristic parameter Wpe (width of peak) shows the width of the (highest) local peak in the histogram measured preferably at 50% height.

Figure 31:
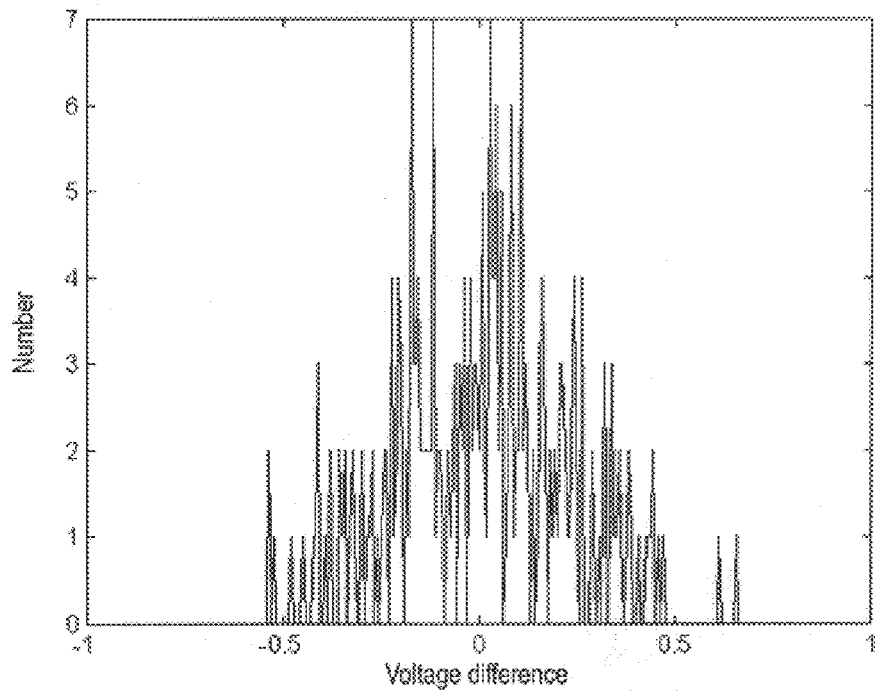
FIG. 31 shows an example of a graph n($\Delta u_{i(neg)}$).

The graph n($\Delta u_{i(neg)}$) is formed by calculating the differences in starting voltages of consecutive negative pulses (the starting voltage of the preceding negative pulse is subtracted from the starting voltage of the negative pulse) during the entire measurement period and making them into a histogram. An example of the graph n($\Delta u_{i(neg)}$) is shown in FIG. 31.

The characteristic parameters are the same as in the case of the graph n($\Delta u_{i(pos)}$).

The above-mentioned FIR filter is preferably a FIR filter of the 8th order whose barrier frequency is 0.1×$f_N$, for instance. The frequency $f_N$ is a Nyquist frequency, i.e. half of the sampling frequency. The frequency $f_N$ can, for instance, in the case of the graphs φ-$q_{max}$, φ-$q_{avg}$ and φ-n be defined as follows: 360° on the phase angle axis corresponds to 20 milliseconds at 50 Hz frequency on the time axis and because the phase angle axis is divided into 256 phase windows, the sampling period is 0.020 s / 256. The frequency then is $f_N$=6400 Hz and the barrier frequency of the filter is 0.1×$f_N$=640 Hz. In the case of the histograms, the frequency cannot in this manner be defined on physical grounds, because their x axis is not time. Any frequency can, in principle, be used. In defining the filter, the absolute value of $f_N$ is, in fact, not essential, but it is enough to know the order of the filter (e.g. 8) and the barrier frequency coefficient (e.g. 0.1) which defines the barrier frequency of the filter in relation to a half of the sampling frequency. The purpose of FIR filters is to show more clearly the main shapes of the envelope of the graph being filtered.

Examples of Partial Discharge Causes Described in the Reference Library 600

The partial discharge causes described in the reference library 600 can, for instance, be divided into four main types: spark discharge, corona discharge, surface discharge and cavity discharge. For each main discharge type, there are preferably 3 to 7 partial discharge causes described (the partial discharge signals caused by defects related to one main discharge type are different, even though the discharge type is in its main properties the same).

The following spark discharge-type partial discharge causes, for instance, are described: conductive part in a floating potential, badly connected conductor support or flash barrier of a PAS conductor, loose conductor connection and loose connection in the partial discharge sensor of the system.

The following corona discharge-type partial discharge causes, for instance, are described: sharp edge in the conductor or other live part, corona discharge at the point of a break-off rod of a disconnector, corona discharge in the partial discharge sensor of the system.

The following surface discharge-type partial discharge causes, for instance, are described: broken insulator, tree fallen on a PAS conductor, touching PAS conductors, PAS conductor touching a grounded part, dirty insulator, defect in the cable shoe, and surface discharge in the partial discharge sensor of the system.

The following cavity discharge-type partial discharge causes, for instance, are described: defect in the metal oxide overvoltage protector, badly connected pin-type insulator, defect in instrument transformer, internal defect in the partial discharge sensor of the system.

It should be noted that what is presented above is only one possible embodiment of the invention. The method and system of the invention can be altered from what is described herein for instance as follows: adding other identification methods or using only a part of the available main identification methods (phase angle and pulse sequence analysis), changing the content of the main identification methods, changing the combination of the results of the main identification methods, changing the medium frequency and bandwidth of the measuring band (the medium frequency can also be considerably higher than the bandwidth), setting the medium frequency by program by adding in front of the digitising chain a mixer and a local oscillator whose frequency can be set by program, setting the bandwidth by program, changing/adding graph types (e.g. peak value variance or standard variation of pulses by phase window), changing/adding characteristic parameters, using different membership functions for different characteristic parameters, and changing the number of phase windows in the graphs.

It is obvious to a person skilled in the art that while technology advances, the basic idea of the invention can be implemented in many different ways. The invention and its embodiments are thus not restricted to the examples described above, but can vary within the scope of the claims.

What is claimed is:

1. A method of identifying the cause of a partial discharge occurring in an electric system, which method comprises:
   measuring a variable of the electric system, such as voltage or current, to which partial discharges occurring in the electric system cause pulses,
   separating the pulses caused by partial discharges occurring in the measured variable,
   defining and storing pulse parameters depicting the partial discharge pulses, or information from which the pulse parameters can be derived,
   defining one or more pulse group graphs by means of the pulse parameters after at least a predefined number of partial discharge pulses known as a pulse group, has been obtained,
   defining one or more characteristic parameters from said one or more pulse group graphs, and
   determining the cause of the partial discharge by means of the defined characteristic parameters and a predefined reference library, which library describes one or more partial discharge causes,
   the reference library comprising one or more descriptions which correspond to partial discharge causes described by means of one or more membership functions of fuzzy logic, and for each characteristic parameter to be used, there is a corresponding membership function,
   said determining the cause of the partial discharge comprises:
   placing the defined characteristic parameters into the membership functions corresponding to the characteristic parameters of each description in the reference library and calculating the values of the membership functions, and
   defining the cause of the partial discharge on the basis of the values of the membership functions.

2. A method as claimed in claim 1, wherein the determining of the cause of the partial discharge also comprises:
   summing the values of the membership functions of each description into description-specific index numbers, and the cause of the partial discharge is determined on the basis of the values of the index numbers.

3. A method as claimed in claim 1, wherein when there are at least two defined characteristic parameters, the determining of the cause of the partial discharge also comprises multiplying the values of the membership functions by weighting coefficients corresponding to the characteristic parameters corresponding to the membership functions, in which case the weighting coefficient depicts the ability of the corresponding characteristic parameter to distinguish the partial discharge causes described in the reference library from each other.

4. A method as claimed in claim 1, wherein the forming of the reference library comprises:
   measuring during various conditions several samples of partial discharge pulses caused by one or more causes of partial discharges to be described,
   defining on the basis of the measurements one or more pulse group graphs for each sample of each partial discharge cause to be described,
   defining from said at least one graph one or more characteristic parameters for each sample of each partial discharge cause to be described, and
   forming for each specific characteristic parameter of each partial discharge cause to be described a membership function of fuzzy logic on the basis of the range of variation of th values of said characteristic parameter defined from various samples of the partial discharge cause being described.

5. A method as claimed in claim 1, wherein the pulse parameters comprise one or more of the following: peak value of pulse, starting phase angle of pulse, sequence number of the network cycle during which the pulse occurred and starting time stamp of the network cycle during which the pulse occurred.

6. A method as claimed in claim 5, wherein one or more pulse group graphs and characteristic parameters defined from the graphs are defined by means of a phase angle analysis.

7. A method as claimed in claim 6, wherein said graphs defined by a phase angle analysis comprise at least one of the following:

graph φ-$q_{max}$ containing the maximum amplitude of discharge pulses occurred during several network cycles in each phase window, graph φ-$q_{avg}$ containing the average amplitude of discharge pulses occurred during several network cycles in each phase window, and graph φ-n containing the total number of discharge pulses occurred during several network cycles in each phase window.

8. A method as claimed in claim 7, wherein said characteristic parameters defined by phase angle analysis comprise at least one of the following:

characteristic parameter Q (intensity asymmetry) which describes the difference between the strengths or number of negative and positive half-cycle pulses, characteristic parameter Phi (phase asymmetry) which describes the difference in the starting phase angles of negative and positive half-cycle pulse series, characteristic parameter Phi+, i.e. the starting phase angle of the positive half-cycle pulse series, characteristic parameter Phi−, i.e. the starting phase angle of the negative half-cycle pulse series, characteristic parameter cc (cross correlation) which describes the difference in shape of the positive and negative half-cycle discharge pulse series, characteristic parameter mcc (modified cross correlation) which is the product of the characteristic parameters Q, Phi and cc, characteristic parameters Sk+ and Sk− which described the skew of the envelopes of the positive and negative half-cycle pulse series in comparison with the normal distribution, characteristic parameters Ku+ and Ku− which describe the flat-topness of the envelopes of the positive and negative half-cycle pulse series in comparison with the normal distribution, and characteristic parameters Pe+ and Pe− which describe the number of local peaks of the filtered envelopes of the positive and negative half-cycle pulse series.

9. A method as claimed in claim 5, wherein one or more pulse group graphs and characteristic parameters defined from the graphs are defined by means of a pulse sequence analysis.

10. A method as claimed in claim 9, wherein said graphs defined by a pulse sequence analysis comprise a graph n($\Delta u_i$) which is formed by calculating the differences of starting voltages of consecutive pulses during the entire measurement period and forming them into a histogram.

11. A method as claimed in claim 10, wherein said characteristic parameters defined from the graph n($\Delta u_i$) by a phase angle analysis comprise at least one of the following:

characteristic parameter Pe (number of peaks) which shows the number of local peaks in the histogram, characteristic parameter Do (distance between furthest peaks) which shows the distance between the furthest local peaks in the histogram, characteristic parameter D0avg (average distance of peaks from zero) which shows the average distance of the local peaks in the histogram from the zero point of the histogram, characteristic parameter Wavg (average width of peaks) which shows the average width of the local peaks in the histogram, and characteristic parameter Wdist (standard deviation of peak width) which shows the standard deviation of the width of the local peaks in the histogram.

12. A method as claimed in claim 9, wherein said graphs defined by means of a pulse sequence analysis comprise a graph dt-q which is a matrix containing time differences of pulses to a preceding pulse of approximately equal size in apparent charge.

13. A method as claimed in claim 12, wherein said characteristic parameters defined from the graph dt-q by a phase angle analysis comprise at least one of the following:

characteristic parameter Xmin ($x_{min}$ coordinate) which shows the smallest time difference of same-sized pulses, which occurs commonly in measurement, characteristic parameter Xmax ($x_{max}$ coordinate) which shows the biggest time difference of same-sized pulses, which occurs commonly in measurement, characteristic parameter Ymin ($y_{min}$ coordinate) which shows the lowest peak value of a pulse, which occurs commonly in measurement, characteristic parameter Ymax ($y_{max}$ coordinate) which shows the highest peak value of a pulse, which occurs commonly in measurement, characteristic parameter Gx (centre of gravity, x coordinate) which is the x coordinate of the centre of gravity calculated from the distribution of time differences of same-sized pulses, characteristic parameter Gy (centre of gravity, y coordinate) which is the y coordinate of the centre of gravity calculated from the distribution of time differences of same-sized pulses.

14. A method as claimed in claim 9, wherein said graphs defined by a pulse sequence analysis comprise at least either of the following:

graph n($\Delta u_{i(pos)}$) which is formed by calculating the differences of starting voltages of consecutive positive pulses during the entire measurement period and making them into a histogram, and graph n($\Delta u_{i(neg)}$) which is formed by calculating the differences of starting voltages of consecutive negative pulses during the entire measurement period and making them into a histogram.

15. A method as claimed in claim 14, wherein said characteristic parameters defined by a phase angle analysis from the graph n($\Delta u_{i(pos)}$) and/or n($\Delta u_{i(meg)}$) comprise at least either of the following:

characteristic parameter Lpe (location of peak) which shows the location of the (highest) local peak in the histogram on a voltage axis, and characteristic parameter Wpe (width of peak) which shows the width of the (highest) local peak in the histogram measured preferably at 50% height.

16. A method as claimed in claim 2, wherein the cause which has the highest index number defined to the corresponding defect description and exceeds a pre-set threshold value is reported as the partial discharge cause.

17. A method as claimed in claim 2, wherein an alarm is given if a defined index number exceeds a pre-set alarm limit value corresponding to said partial discharge cause.

18. A system of identifying the cause of a partial discharge occurring in an electric system, which system comprises:

measuring means arranged to measure a variable of the electric system, such as voltage or current, to which partial discharge occurring in the electric system cause pulses, to separate the pulses caused by partial discharges occurring in the measured variable, to define and store pulse parameters depicting the partial discharge pulse, or information from which the pulse parameters can be derived, analysing means arranged to define one or more pulse group graphs by means of the pulse parameters after at least a predefined number of partial discharge pulses known as a pulse group, has been obtained, to define one or more characteristic parameters from one or more pulse group graphs, and to determine the cause of the partial discharge by means of the defined characteristic parameters and a predefined reference library, which library describes one or more partial discharge causes, wherein the reference library comprises one or more descriptions which correspond to partial discharge causes described by means of one or more membership functions of fuzzy logic, and for each characteristic parameter to be used, there is a corresponding membership function, and the analysing means, when determining the partial discharge cause, are also arranged to place the defined characteristic parameters into the membership functions corresponding to the characteristic parameters of each description in the reference library and to calculate the values of the membership functions and to determine the partial discharge cause on the basis of the membership function values.

19. A system as claimed in claim 18, wherein the analysing means, when determining the partial discharge cause, are also arranged to sum the membership function values of each description into description-specific index numbers, whereby the analysing means are arranged to determine the partial discharge cause on the basis of the index number values.

20. A system as claimed in claim 18, wherein the analysing means, when determining the partial discharge cause and when there are at least two defined characteristic parameters, are also arranged to multiply the membership function values by weighting coefficients corresponding to the characteristic parameters corresponding to the membership functions, whereby the weighting coefficient describes the ability of the corresponding characteristic parameter to distinguish from each other the causes of a partial discharge described in the reference library.

* * * * *

UNITED STATES PATENT AND TRADEMARK OFFICE
CERTIFICATE OF CORRECTION

PATENT NO.    : 6,445,189 B1
DATED         : September 3, 2002
INVENTOR(S)   : Pertti Pakonen, Mats Björkqvist and Vesa Latva-Pukkila It is certified that error appears in the above-identified patent and that said Letters Patent is hereby corrected as shown below:

<u>Title page,</u>
Item [74], should read -- [74] *Attorney, Agent, or Firm*-Michael M. Rickin, Esq. --

Signed and Sealed this

Fifteenth Day of October, 2002

*Attest:*

*Attesting Officer*

JAMES E. ROGAN
*Director of the United States Patent and Trademark Office*